United States Patent
Hayashi

(10) Patent No.: US 9,584,063 B2
(45) Date of Patent: Feb. 28, 2017

(54) CONCENTRATING PHOTOELECTRIC CONVERSION DEVICE

(71) Applicant: Panasonic Intellectual Property Management Co., Ltd., Osaka (JP)

(72) Inventor: Nobuhiko Hayashi, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 84 days.

(21) Appl. No.: 14/667,387

(22) Filed: Mar. 24, 2015

(65) Prior Publication Data

US 2015/0200622 A1 Jul. 16, 2015

Related U.S. Application Data

(63) Continuation of application No. PCT/JP2014/003341, filed on Jun. 23, 2014.

(30) Foreign Application Priority Data

Jul. 12, 2013 (JP) ................................ 2013-146281

(51) Int. Cl.
*H01L 31/02* (2006.01)
*H02S 20/32* (2014.01)
(Continued)

(52) U.S. Cl.
CPC ............ *H02S 20/32* (2014.12); *H01L 31/054* (2014.12); *H02S 10/00* (2013.01); *H02S 40/22* (2014.12); *Y02E 10/52* (2013.01)

(58) Field of Classification Search
None
See application file for complete search history.

(56) References Cited

U.S. PATENT DOCUMENTS

| 5,707,458 A | 1/1998 | Nagashima et al. |
| 9,331,219 B2* | 5/2016 | Zivkovic ............. H01L 31/0232 |
| 2011/0017903 A1* | 1/2011 | Fangman ............... F24J 2/1047 |
| | | 250/203.4 |

FOREIGN PATENT DOCUMENTS

| JP | 53-053040 | 5/1978 |
| JP | 9-148610 | 6/1997 |
| JP | 2007-180257 | 7/2007 |

OTHER PUBLICATIONS

International Search Report of PCT application No. PCT/JP2014/003341 dated Jul. 29, 2014.

* cited by examiner

*Primary Examiner* — Magali P Slawski
(74) *Attorney, Agent, or Firm* — McDermott Will & Emery LLP

(57) ABSTRACT

The present disclosure provides a concentrating photoelectric conversion device that can efficiently obtain a power generation amount even if a deflection and a strain are generated. A position shift detection element group (7A, 7B, 7C, and 7D) includes some photoelectric conversion elements in a plurality of photoelectric conversion elements (7n). Some photoelectric conversion elements are disposed with centers of light receiving regions (100) of the photoelectric conversion elements being shifted from a center of a focused spot (300) in upward, downward, rightward, and leftward directions by a predetermined distance in a state where the light receiving surface of the power generation panel is opposite to light. The position shift detection element groups are provided in at least three places on the light receiving surface of the power generation panel to correct a light tracking orbit.

6 Claims, 25 Drawing Sheets

(51) Int. Cl.
*H01L 31/04* (2014.01)
*H01L 31/054* (2014.01)
*H02S 40/22* (2014.01)

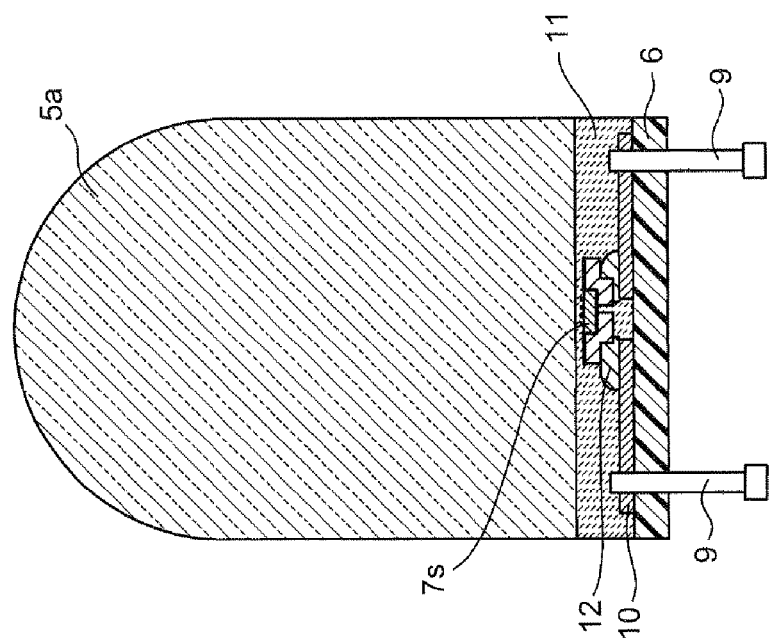
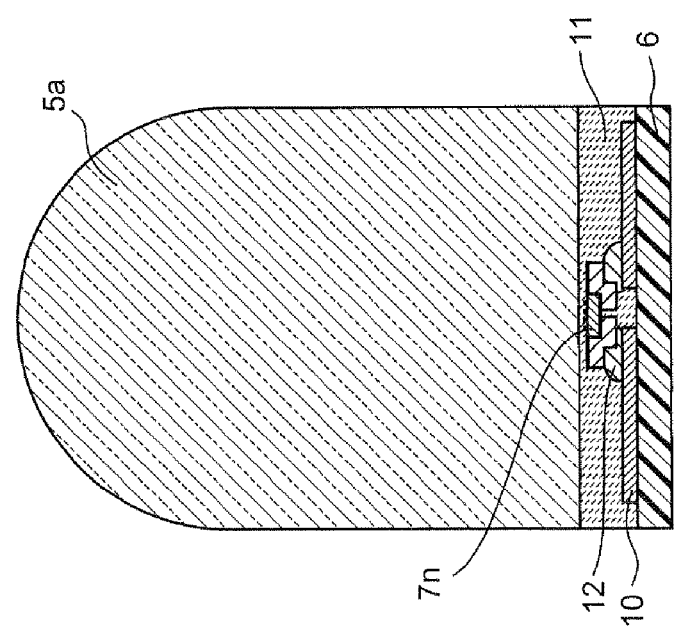
FIG. 7A
FIG. 7B

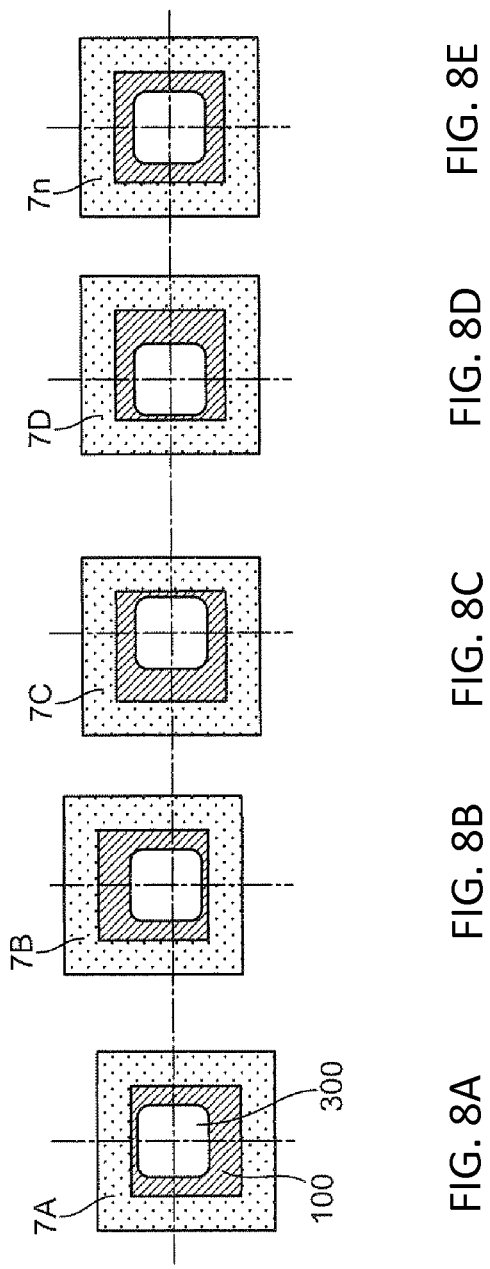

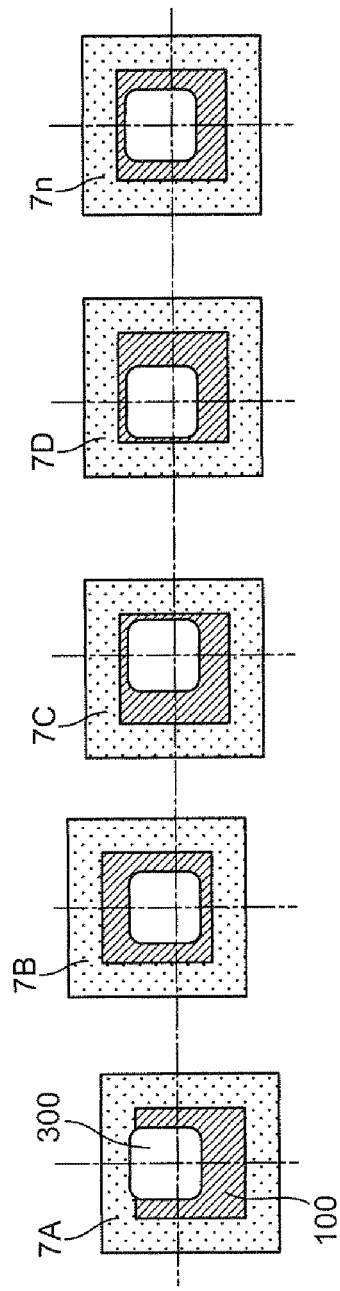

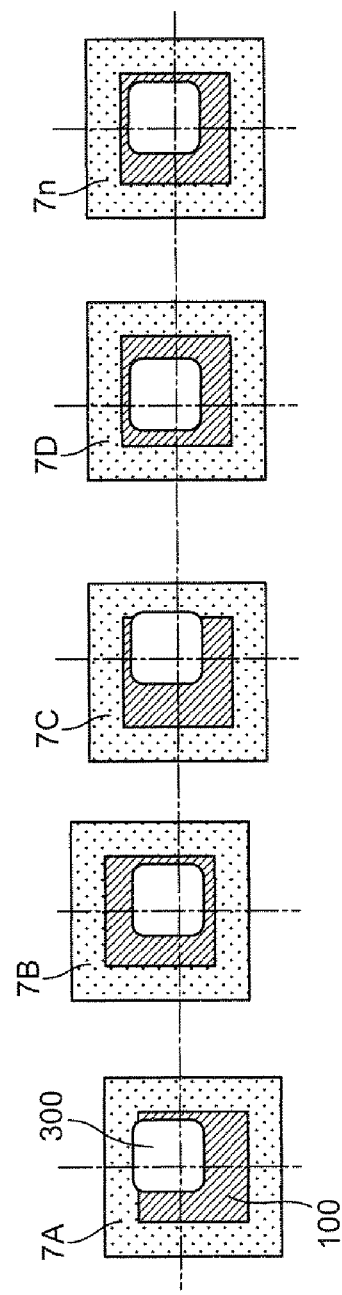

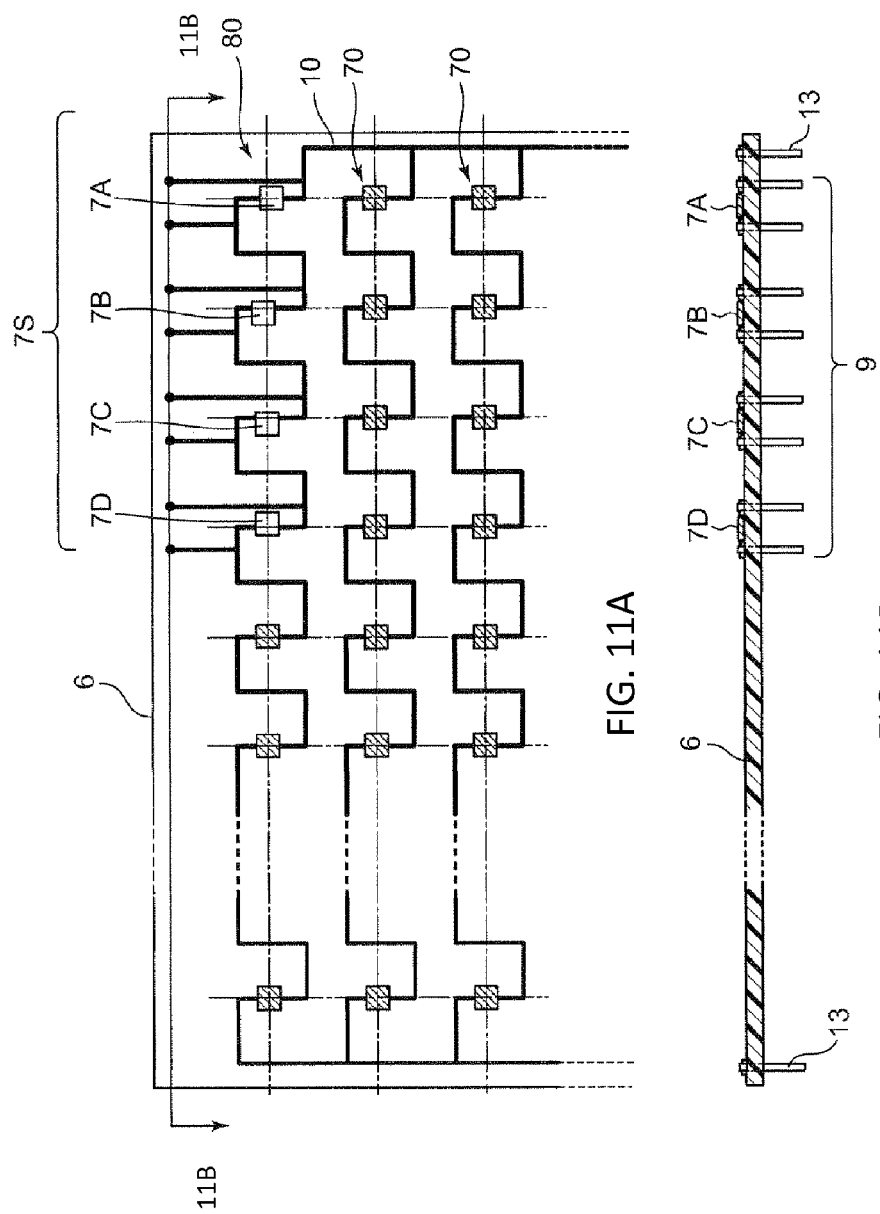

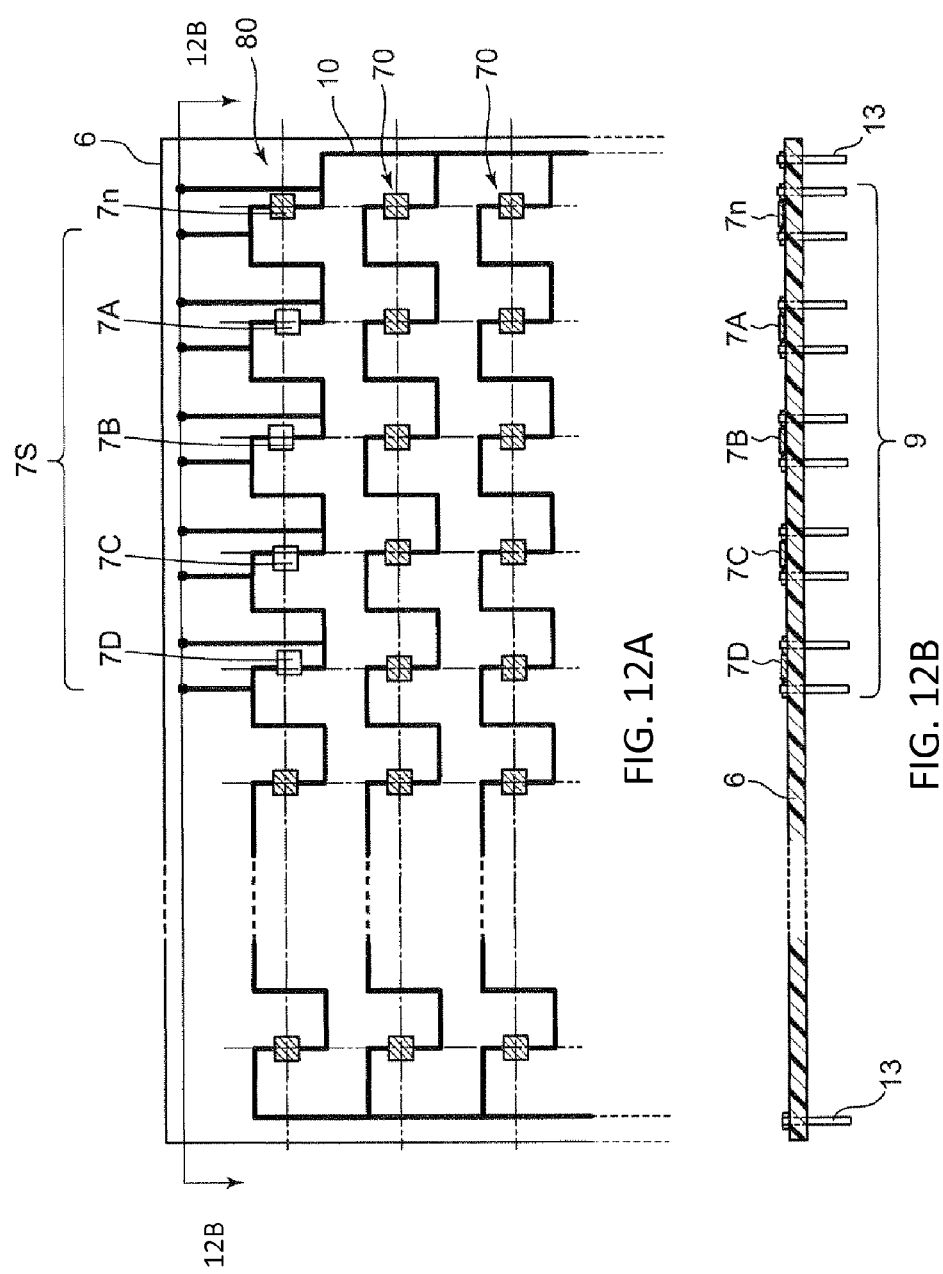

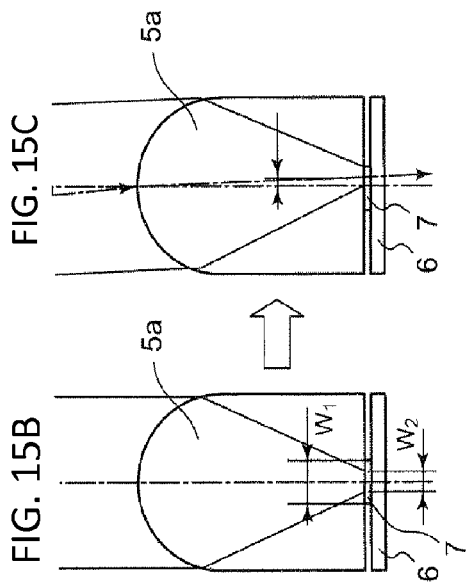
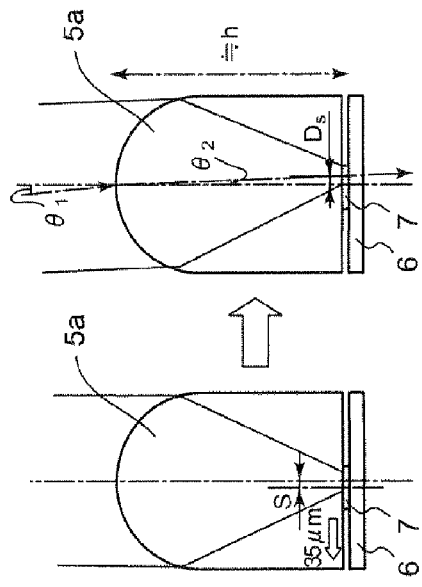
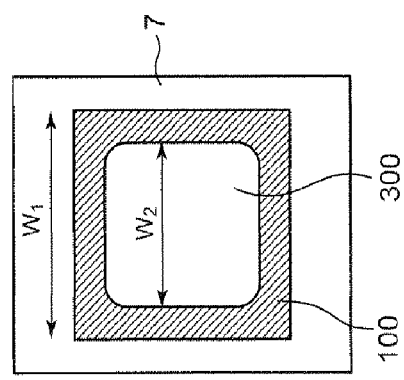
FIG. 15A
FIG. 15B
FIG. 15C
FIG. 15D
FIG. 15E

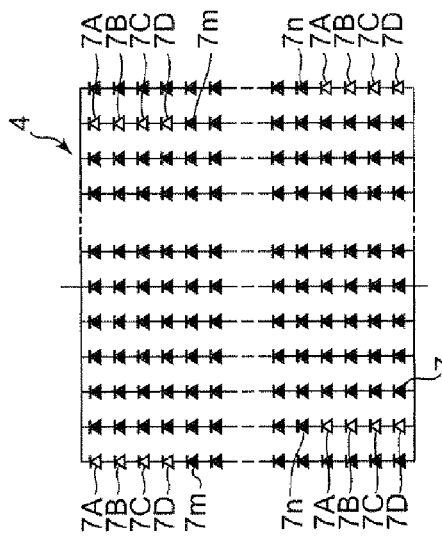
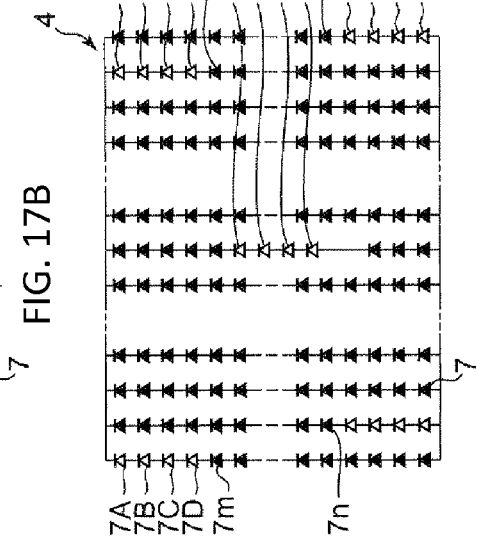
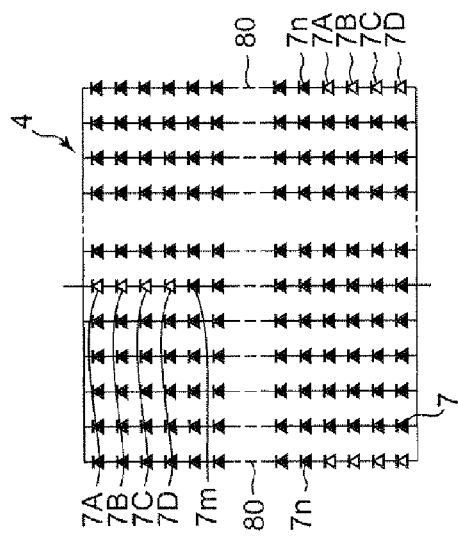

CONCENTRATING PHOTOELECTRIC CONVERSION DEVICE

This is a continuation of International Application No. PCT/JP2014/003341, with an international filing date of Jun. 23, 2014, which claims priority of Japanese Patent Application No. 2013-146281, filed on Jul. 12, 2013, the contents of which are hereby incorporated by reference.

BACKGROUND

1. Technical Field

The present invention relates to a concentrating photoelectric conversion device that collects light to convert the light into power.

2. Description of the Related Art

Photoelectric conversion devices, such as a solar cell, in which sunlight is used as an environmentally-friendly energy source, nowadays attract attention. In photoelectric conversion devices, a concentrating photoelectric conversion device that collects the sunlight is used to enhance power generation efficiency. Although a photoelectric conversion element (power generation element) used in the photoelectric conversion device has high conversion efficiency, the photoelectric conversion element is very expensive. Therefore, a high-magnification optical mechanism having a light collecting magnification of 1000 times or more is provided in the photoelectric conversion device to effectively use the expensive photoelectric conversion element (for example, see Unexamined Japanese Patent Publication No. 53-53040).

Additionally, the large-scale photoelectric conversion device that outputs large power is being developed in order to enlarge the photoelectric conversion device.

SUMMARY

The present invention provides a concentrating photoelectric conversion device of the present disclosure includes: a power generation panel in which a plurality of power generation modules including a plurality of photoelectric conversion elements are arrayed in a planar manner, the photoelectric conversion element generating power with collected light being incident thereto; and a support that supports the plurality of power generation panels, the support including a light tracking mechanism that opposes a light receiving surface of the power generation panel to light. At this point, in a state where the light receiving surface of the power generation panel is opposed to the light, some photoelectric conversion elements in the plurality of photoelectric conversion elements are disposed with centers of light receiving regions of the photoelectric conversion elements being shifted from a center of a focused spot in upward, downward, rightward, and leftward directions by a predetermined distance, some photoelectric conversion elements are constructed with a position shift detection element group including a first position shift detection element, a second position shift detection element, a third position shift detection element, and a fourth position shift detection element, the first position shift detection element, the second position shift detection element, the third position shift detection element, and the fourth position shift detection element detecting position shifts in the upward, downward, rightward, and leftward directions, the first position shift detection element, the second position shift detection element, the third position shift detection element, and the fourth position shift detection element are connected in series, and the position shift detection element groups are provided in at least three places in the light receiving surface of the power generation panel, and the light tracking mechanism corrects an orbital position based on detection voltages of the first position shift detection element, the second position shift detection element, the third position shift detection element, and the fourth position shift detection element in the position shift detection element group.

The concentrating photoelectric conversion device of the present disclosure has the high power generation efficiency even if the deflection and strain are generated.

Other features, elements, processes, steps, characteristics and advantages of the present invention will become more apparent from the following detailed description of preferred embodiments of the present invention with reference to the attached drawings.

BRIEF DESCRIPTION OF DRAWINGS

FIG. 7A is a sectional view illustrating a light collecting element unit including a normal power generation element.

FIG. 7B is a sectional view illustrating a light collecting element unit including a position shift detection element.

FIG. 8A is a view illustrating position shift detection element 7s as first position shift detection element 7A that detects the position shift in the upward direction.

FIG. 8B is a view illustrating position shift detection element 7s as second position shift detection element 7B that detects the position shift in the downward direction.

FIG. 8C is a view illustrating position shift detection element 7s as third position shift detection element 7C that detects the position shift in the rightward direction.

FIG. 8D is a view illustrating position shift detection element 7s as fourth position shift detection element 7D that detects the position shift in the leftward direction.

FIG. 8E is a view illustrating the state where normal power generation element 7n is disposed at a correct position opposite to the sun.

FIG. 9A is a view illustrating each position shift detection element and the normal power generation element when a position of a focused spot is shifted upward.

FIG. 9B is a view illustrating each position shift detection element and the normal power generation element when a position of a focused spot is shifted upward.

FIG. 9C is a view illustrating each position shift detection element and the normal power generation element when a position of a focused spot is shifted upward.

FIG. 9D is a view illustrating each position shift detection element and the normal power generation element when a position of a focused spot is shifted upward.

FIG. 9E is a view illustrating each position shift detection element and the normal power generation element when a position of a focused spot is shifted upward.

FIG. 10A is a view illustrating each position shift detection element and the normal power generation element when the position of the focused spot is shifted in an upward rightward direction.

FIG. 10B is a view illustrating each position shift detection element and the normal power generation element when the position of the focused spot is shifted in an upward rightward direction.

FIG. 10C is a view illustrating each position shift detection element and the normal power generation element when the position of the focused spot is shifted in an upward rightward direction.

FIG. 10D is a view illustrating each position shift detection element and the normal power generation element when the position of the focused spot is shifted in an upward rightward direction.

FIG. 10E is a view illustrating each position shift detection element and the normal power generation element when the position of the focused spot is shifted in an upward rightward direction.

FIG. 11A is a view illustrating a wiring board on which the position shift detection element is mounted in the concentrating photoelectric conversion device of the first embodiment.

FIG. 11B is a view illustrating a wiring board on which the position shift detection element is mounted in the concentrating photoelectric conversion device of the first embodiment.

FIG. 12A is a view illustrating the wiring board on which the position shift detection element is mounted in the concentrating photoelectric conversion device of the first embodiment.

FIG. 12B is a view illustrating the wiring board on which the position shift detection element is mounted in the concentrating photoelectric conversion device of the first embodiment.

FIG. 15A is a view illustrating a relationship between an angle of sunlight and a position shift of the focused spot when the sunlight is incident on the light collecting element unit.

FIG. 15B is a view illustrating a relationship between an angle of sunlight and a position shift of the focused spot when the sunlight is incident on the light collecting element unit.

FIG. 15C is a view illustrating a relationship between an angle of sunlight and a position shift of the focused spot when the sunlight is incident on the light collecting element unit.

FIG. 15D is a view illustrating a relationship between an angle of sunlight and a position shift of the focused spot when the sunlight is incident on the light collecting element unit.

FIG. 15E is a view illustrating a relationship between an angle of sunlight and a position shift of the focused spot when the sunlight is incident on the light collecting element unit.

FIG. 17A is a circuit diagram illustrating a configuration example in which a plurality of position shift detection elements are provided in a power generation circuit of the power generation module in the concentrating photoelectric conversion device of the first embodiment.

FIG. 17B is a circuit diagram illustrating a configuration example in which a plurality of position shift detection elements are provided in a power generation circuit of the power generation module in the concentrating photoelectric conversion device of the first embodiment.

FIG. 17C is a circuit diagram illustrating a configuration example in which a plurality of position shift detection elements are provided in a power generation circuit of the power generation module in the concentrating photoelectric conversion device of the first embodiment.

FIG. 17D is a circuit diagram illustrating a configuration example in which a plurality of position shift detection elements are provided in a power generation circuit of the power generation module in the concentrating photoelectric conversion device of the first embodiment.

DETAILED DESCRIPTION OF EMBODIMENTS

Figure 1B:
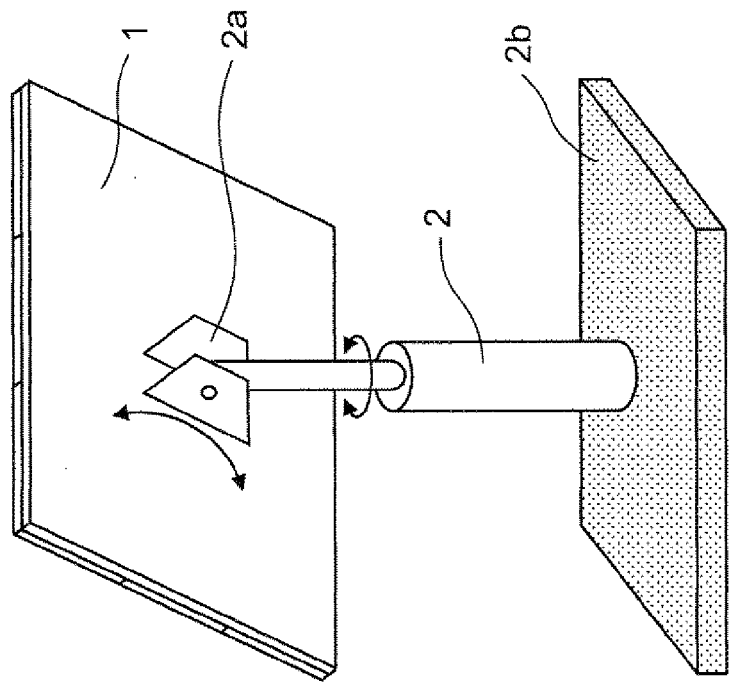
FIG. 1B is a perspective view illustrating a rear surface side of the power generation panel.

In the photoelectric conversion device that is being developed as the energy source in which the sunlight is used, a deflection and a strain become a large problem in the photoelectric conversion device because of the trend of the high-magnification concentrating type and the enlargement.

In the concentrating photoelectric conversion device, it is necessary that a focal spot of light collected by an optical mechanism (such as a lens) be disposed on a light receiving region of the small photoelectric conversion element. In order to obtain large output, the concentrating photoelectric conversion device is formed into a large panel shape (plate shape) by vertically and horizontally arraying many power generation modules each of which is constructed with the optical mechanism and the photoelectric conversion element in a planar manner.

A sun tracking mechanism is disposed in the concentrating photoelectric conversion device such that the optical mechanism is always oriented toward a solar position, and such that the focal spot of the sunlight is disposed on the light receiving region of each photoelectric conversion element (for example, see Unexamined Japanese Patent Publication No. 53-53040).

Frequently the concentrating photoelectric conversion device is installed in an area where an environmental temperature changes largely, and sometimes the deflection and strain are generated due to a difference in expansion coefficient between components.

The present disclosure provides a concentrating photoelectric conversion device that has the high power generation efficiency even if the deflection and strain are generated.

Hereinafter, embodiments will be described in detail with reference to the accompanying drawings. Various modes of the present invention will be described below before the embodiments are described in detail with reference to the accompanying drawings.

A concentrating photoelectric conversion device of a first aspect includes: a power generation panel in which a plurality of power generation modules including a plurality of photoelectric conversion elements are arrayed in a planar manner, the photoelectric conversion element generating power with collected light being incident thereto; and a support that supports the plurality of power generation panels, the support including a light tracking mechanism that opposes a light receiving surface of the power generation panel to light. At this point, in a state where the light receiving surface of the power generation panel is opposed to the light, some photoelectric conversion elements in the plurality of photoelectric conversion elements are disposed with centers of light receiving regions of the photoelectric conversion elements being shifted from a center of a focused spot in upward, downward, rightward, and leftward directions by a predetermined distance, some photoelectric conversion elements are constructed with a position shift detection element group including a first position shift detection element, a second position shift detection element, a third position shift detection element, and a fourth position shift detection element, the first position shift detection element, the second position shift detection element, the third position shift detection element, and the fourth position shift detection element detecting position shifts in the upward, downward, rightward, and leftward directions, the first position shift detection element, the second position shift detection element, the third position shift detection element, and the fourth position shift detection element are connected in series, and the position shift detection element groups are provided in at least three places in the light receiving surface of the power generation panel, and the light tracking mechanism corrects an orbital position based on detection voltages of the first position shift detection element, the second position shift detection element, the third position shift detection element, and the fourth position shift detection element in the position shift detection element group.

The concentrating photoelectric conversion device of the first aspect can obtain the high power generation efficiency even if the deflection and strain are generated.

In the concentrating photoelectric conversion device of a second aspect, the plurality of photoelectric conversion elements included in the power generation module in the first aspect is constructed with the position shift detection element group and a plurality of normal photoelectric conversion elements, the position shift detection element group being disposed with the centers of the light receiving regions being shifted from the center of the focused spot in the upward, downward, rightward, and leftward directions by the predetermined distance in the state where the light receiving surface of the power generation panel is opposed to the light, the plurality of normal photoelectric conversion elements being disposed such that the centers of the light receiving regions coincide with the center of the focused spot, and the power generation module is constructed with a parallel circuit of a plurality of position shift detection series circuits and a plurality of normal power generation element series circuits, the plurality of normal photoelectric conversion elements being connected in series to the position shift detection element group in the plurality of position shift detection series circuits, the plurality of normal photoelectric conversion elements being connected in series in the plurality of normal power generation element series circuits.

When the generation of the position shift is detected, the concentrating photoelectric conversion device of the second aspect can reduce a ratio of the current amount decrease of the power generation circuit while reducing a ratio of the voltage decrease of the whole power generation circuit.

In the concentrating photoelectric conversion device of a third aspect, a short-circuit current value of the photoelectric conversion element used in the position shift detection element group of the position shift detection series circuit in the second aspect is larger than a minimum short-circuit current in the normal photoelectric conversion element used in the position shift detection series circuit.

In the case where the current value of the position shift detection element decreases due to the generation of the position shift, the concentrating photoelectric conversion device of the third aspect can decrease an influence on the power generation efficiency and the power generation amount.

In the concentrating photoelectric conversion device of a fourth aspect, the photoelectric conversion element having the output voltage higher than that of the normal photoelectric conversion element of the normal power generation element series circuit is used in the position shift detection element group of the position shift detection series circuit in the second or third aspect.

In the case where the voltage value of the position shift detection element decreases during the detection of the position shift, the concentrating photoelectric conversion device of the fourth aspect can decrease an influence on the power generation circuit of the whole concentrating photoelectric conversion device.

In the concentrating photoelectric conversion device of a fifth aspect, the position shift detection element groups located in at least three places of the power generation panel are connected in series in any one of the first to fourth aspects.

In the concentrating photoelectric conversion device of the fifth aspect, the voltage of each of the position shift detection element groups in the plurality of places in the power generation panel can be measured with the same current value, the voltage can accurately be measured, and the sun tracking operation can accurately be performed.

In the concentrating photoelectric conversion device of a sixth aspect, the position shift detection element groups are provided in at least three places on the light receiving surface of the power generation module, and the position shift detection element groups located in at least three places of the power generation module are connected in series in any one of the first to fourth aspects.

In the concentrating photoelectric conversion device of the sixth aspect, the voltage of each of the position shift detection element groups in the plurality of places in the power generation module can be measured with the same current value, the voltage can accurately be measured, and the sun tracking operation can accurately be performed.

In the concentrating photoelectric conversion device of a seventh aspect, the support in any one of the first to sixth aspects is supported by a support member in a central portion of a back located on a side opposite to the light receiving surface of the power generation panel, and turned in two axial directions by the light tracking mechanism, and the position shift detection element group located in at least three places is located in a concentric manner about the central portion of the power generation panel, and provided at equal intervals.

In the concentrating photoelectric conversion device of the seventh aspect, the sun tracking operation can accurately be performed such that the light receiving surface in the power generation panel is opposed to the sun.

In the concentrating photoelectric conversion device of an eighth aspect, the light receiving surface of the power generation panel in any one of the first to sixth aspects has a substantially quadrangular shape, and the position shift detection element groups are provided in four corners of the light receiving surface of the power generation panel.

In the concentrating photoelectric conversion device of the eighth aspect, the sun tracking operation can accurately be performed such that the light receiving surface in the power generation panel is opposed to the sun.

In the concentrating photoelectric conversion device of a ninth aspect, the light receiving surface of the power generation panel in any one of the first to sixth aspects has a substantially quadrangular shape, and the position shift detection element groups are provided in four corners and a central portion of the light receiving surface of the power generation panel.

In the concentrating photoelectric conversion device of the ninth aspect, the sun tracking operation can accurately be performed such that the light receiving surface in the power generation panel is opposed to the sun.

In the concentrating photoelectric conversion device of a tenth aspect, the light tracking mechanism in any one of the first to ninth aspects calculates a voltage difference between the detection voltages in the position shift detection element group that detects the position shifts in the directions opposite to each other in the upward, downward, rightward, and leftward directions, and turns the power generation panel in two axial directions to correct a shift angle of the light tracking mechanism.

In the concentrating photoelectric conversion device of the tenth aspect, the sun tracking operation can accurately be performed such that the light receiving surface in the power generation panel is opposed to the sun.

In the concentrating photoelectric conversion device of an eleventh aspect, the light tracking mechanism calculates a voltage difference between the detection voltage in the position shift detection element group that detects the position shifts in the upward, downward, rightward, and leftward directions and the detection voltage of the normal photoelectric conversion element that is connected in series to the position shift detection element group, and turns the power generation panel in two axial directions to correct a shift angle of the light tracking mechanism in any one of the first to ninth aspects.

In the concentrating photoelectric conversion device of the eleventh aspect, the sun tracking operation can accurately be performed such that the light receiving surface in the power generation panel is opposed to the sun.

The sun tracking mechanism that tracks the solar position is provided such that the focused spot of the sunlight is disposed in each of the light receiving regions of all the photoelectric conversion elements in the concentrating photoelectric conversion device. In the structure of the panelized concentrating photoelectric conversion device, the generation of the deflection or strain is inevitable to some extent. For example, according to experiments of the inventors, depending on a combination of materials used, a shift (deflection) of about 0.7 degree is generated in one of end portions of a 20 cm-by-20 cm plate-like power generation module including a plurality of photoelectric conversion units with respect to a horizontal direction by a temperature difference of 70° C. while the other end portion is held in the horizontal direction. Thus, the strain is generated in the power generation module, and the large structural deflection and the strain caused by a difference in expansion coefficient between structural members are generated in the concentrating photoelectric conversion disposition in which the plurality of power generation modules are formed into a panel shape. Therefore, in consideration of the deflection and strain generated in the concentrating photoelectric conversion disposition, it is necessary that the focused spots of the sunlight be disposed with respect to the light receiving regions of all the photoelectric conversion elements as much as possible in order to enhance the power generation efficiency.

Accordingly, in a configuration example of the concentrating photoelectric conversion device of the present disclosure, the ever-changing solar position is correctly tracked, and the maximum power generation amount is generated at that time in consideration of the deflection and strain to enhance the power generation efficiency.

In the concentrating photoelectric conversion device, the structure is enlarged, and the sun tracking mechanism having the complicated configuration is provided, which leads to a weight increase and a production cost increase. Therefore, weight reduction and production cost reduction are achieved in the concentrating photoelectric conversion device of the present disclosure.

Hereinafter, embodiments of the present disclosure will be described in detail with reference to the drawings. However, the detailed description beyond necessity is occasionally neglected. For example, the detailed description of the well-known item or the overlapping description of the substantially same configuration is occasionally neglected. This is because unnecessarily redundancy of the following description is avoided for the purpose of the easy understanding of those skilled in the art.

The inventors provide the accompanying drawings and the following description in order that those skilled in the art sufficiently understand the present disclosure, but the claims are not limited to the accompanying drawings and the following description.

First Embodiment

A concentrating photoelectric conversion device according to a first embodiment will be described below with reference to the accompanying drawings. In the following description of the first embodiment, the rightward, leftward, upward, and downward directions do not indicate the right, left, top, and bottom of the actual device, but indicate the rightward, leftward, upward, and downward directions in the corresponding drawings. In the following description, the concentrating photoelectric conversion device is configured to include a sun tracking mechanism that tracks a position of the sun. However, the concentrating photoelectric conversion device can also be configured to include a light tracking mechanism that simply tracks light.

Figure 1A:
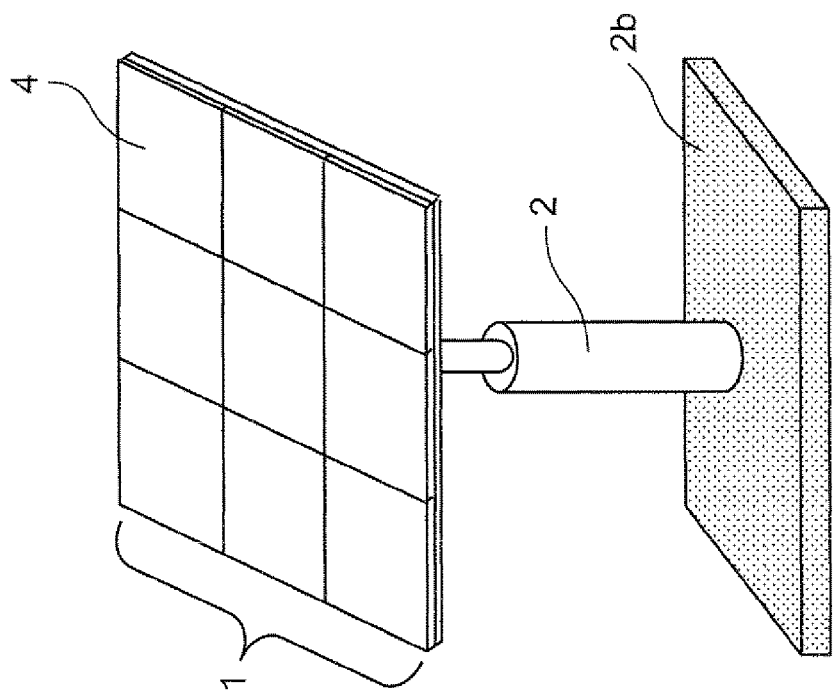
FIG. 1A is a perspective view illustrating a front surface side of a power generation panel in a concentrating photoelectric conversion device according to a first embodiment.

FIG. 1A is a perspective view illustrating a front surface side of a power generation panel receiving the sunlight that is of the light, and FIG. 1B is a perspective view illustrating a rear surface side of the power generation panel.

As illustrated in FIGS. 1A and 1B, the concentrating photoelectric conversion device of the first embodiment includes power generation panel 1 and support 2. Power generation panel 1 includes a light receiving surface receiving the sunlight. Support 2 supports power generation panel 1, and includes sun tracking mechanism 2a that is of the light tracking mechanism which causes the light receiving surface of power generation panel 1 to face the sunlight. Base 2b for supporting power generation panel 1 at a predetermined position, a controller performing drive control of sun tracking mechanism 2a, and the like are provided support 2 in addition to sun tracking mechanism 2a. For example, the sun tracking mechanism is subjected to two-axis (X-axis and Y-axis) drive control, and the drive control of the sun tracking mechanism is performed when deviation of the light receiving surface of power generation panel 1 from a solar orbit is detected.

Power generation panel 1 includes a plurality of power generation modules 4. The plurality of power generation modules 4 are disposed on a board such that side surfaces of power generation modules 4 are in contact with each other. A radiator plate is an example of the board. The term "side surfaces of power generation modules 4 are in contact with each other" includes the case where "the side surfaces are in contact with each other with an adhesive or the like interposed therebetween". Power generation panel 1 is formed into a planar shape. Each power generation module 4 includes a light collecting element unit (solar cell unit) including a light collecting lens, a photoelectric conversion element (hereinafter, referred to as a power generation element), and a wiring board. For example, a plurality of light collecting lenses (lens array) and a plurality of power generation elements, which are provided on the wiring board so as to be opposite to the light collecting lenses, are integrally formed in power generation module 4. In the configuration example of planar power generation panel 1 in FIG. 1A and FIG. 1B, nine power generation modules 4 are provided such that three power generation modules 4 are arrayed in horizontal and vertical directions. Alternatively, more power generation modules 4 may be arrayed in a planar manner. Power generation module 4 may include at least one light collecting lens and at least one power generation element.

The power generation element converts energy of the light incident on the light receiving region into electric energy. The light receiving region of the power generation element means a region where the light energy is converted into the electric energy in the surface of the power generation element. The whole surface of the power generation element may be used as the light receiving region of the power generation element. The light receiving region of the power generation element is also referred to as a light receiving unit of the light collecting element unit.

The light collecting lens includes a surface and a back. The light collecting lens collects the light incident on the surface toward the light receiving region of the power generation element disposed on the back side. The sunlight is an example of the light. Examples of the light collecting lens include a Fresnel lens, a planoconvex lens, a biconvex lens, a prism, and a compound lens. The light collecting lens collects the light incident on the surface in the back direction using refraction of light. There is no limitation to the light collecting lens, but any light collecting lens can be used as long as the light collecting lens has the similar function.

A region where the collected light passes through the surface of the power generation element is previously designed by the light collecting lens and a wavelength of the incident light. The light receiving region of the power generation element may include not only the region through which the collected light passes but also a position away from a light collecting region by a predetermined distance or less. Examples of the predetermined distance include a length depending on a production error of the light collecting lens and a length depending on a production error of the power generation element. For example, in the light receiving region, desirably the energy of the light passing through the light receiving region is greater than or equal to 95% and less than 100% of the energy of the light passing through the back of the light collecting lens. Therefore, an amount of light that is no incident on the power generation element can be decreased even if the light passes through a region deviated from the region where the light passes through the back of the light collecting lens due to a tracking error.

Figure 2:
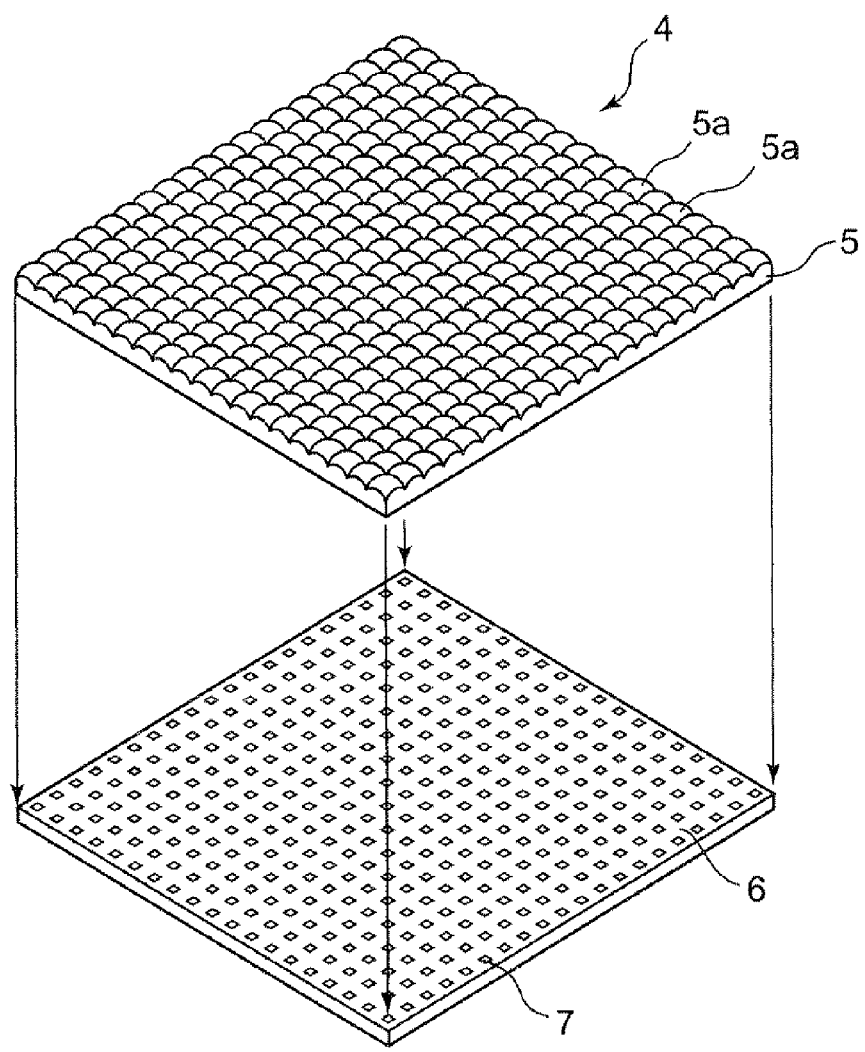
FIG. 2 is an exploded perspective view illustrating a power generation module in the first embodiment.

FIG. 2 is an exploded perspective view illustrating an example of one power generation module 4. As illustrated in FIG. 2, power generation module 4 includes wiring board 6, a plurality of power generation elements 7 that are vertically and horizontally disposed on wiring board 6, and lens array 5 in which a plurality of light collecting lenses 5a are assembled in a plate-like manner so as to correspond to the plurality of power generation elements 7. For example, lens array 5 and wiring board 6 are bonded and fixed to each other using a transparent adhesive such as silicone resin such that a focal position of each light collecting lens 5a becomes a surface (light receiving region) of power generation element 7.

Figure 3:
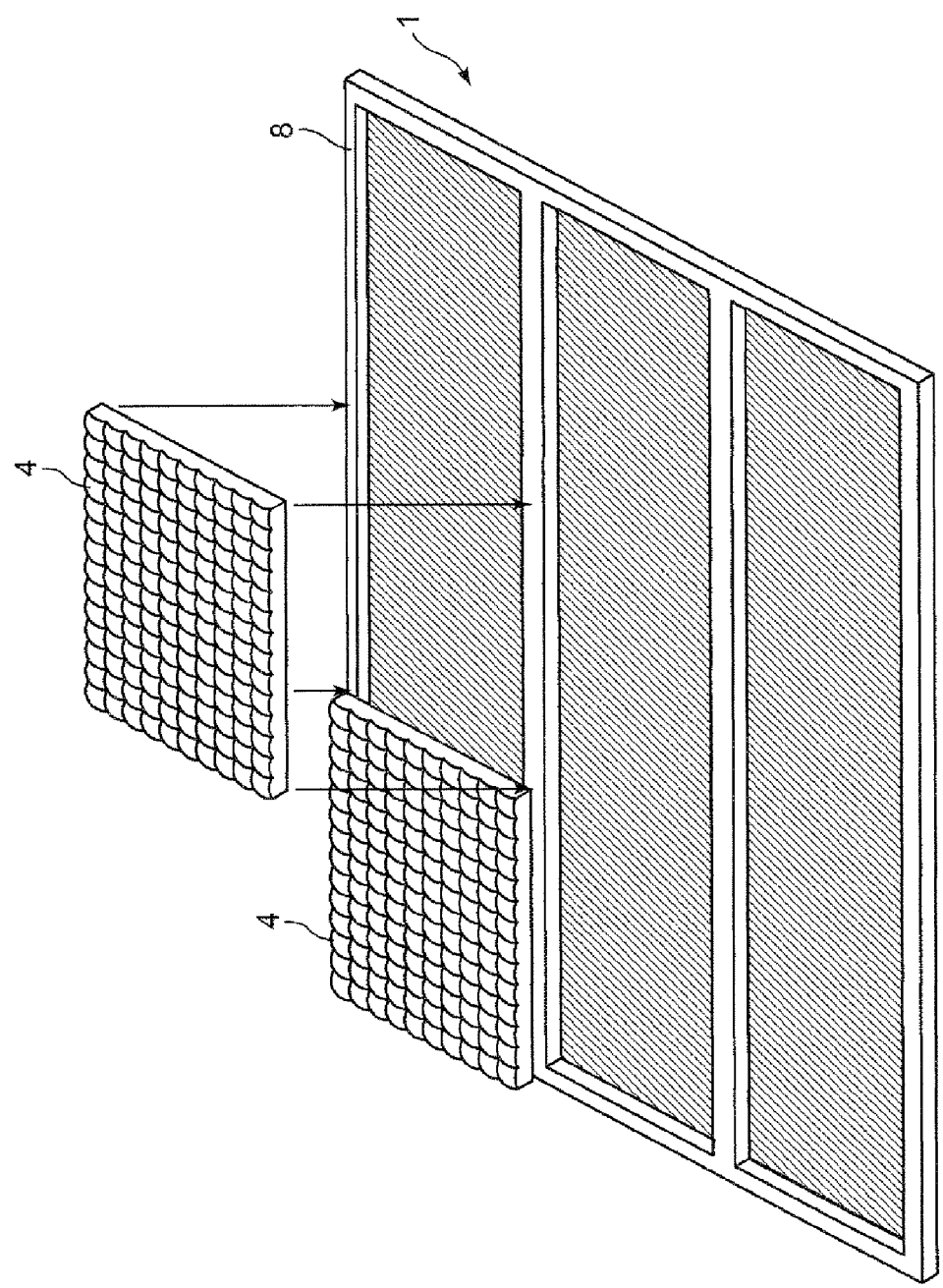
FIG. 3 is a view illustrating a power generation panel producing method in the first embodiment.

FIG. 3 is a view illustrating a method for producing power generation panel 1 in the first embodiment. The plurality of power generation module 4 in FIG. 2 are arrayed on frame 8 of power generation panel 1, and fixed to each other using mechanical and/or chemical fixing means such as a screw and an adhesive. At this point, power generation modules 4 are electrically connected to each other in a desired state with a connection terminal provided in each power generation module 4 according to a specification of power generation panel 1, thereby forming power generation panel 1.

Figure 4:
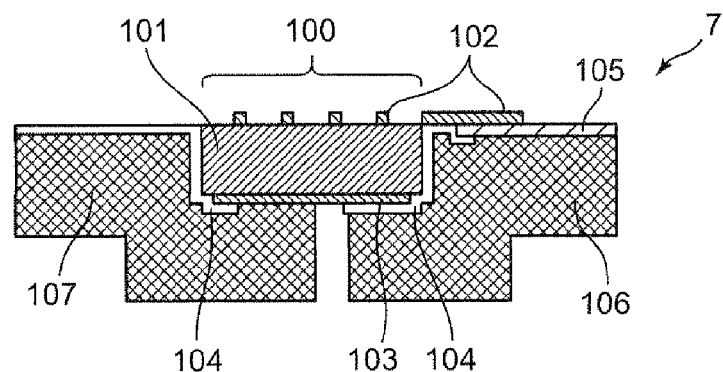
FIG. 4 is a sectional view illustrating a structure of a power generation element of the power generation module in the first embodiment.

FIG. 4 is a sectional view illustrating a structure of power generation element 7 of power generation module 4 in the first embodiment. As illustrated in FIG. 4, first electrode 102 formed into a comb shape is provided on a top surface of semiconductor layer 101 of power generation element 7, and second electrode 103 is provided on a bottom surface of semiconductor layer 101. The top surface of semiconductor layer 101 constitutes light receiving region 100. Because of comb-shape first electrode 102, the sunlight with which light receiving region 100 is irradiated is difficult be blocked by first electrode 102, and is incident on and absorbed by semiconductor layer 101.

First electrode 102 is electrically connected to third electrode 106 leading onto a rear surface side (bottom surface side) of semiconductor layer 101, and second electrode 103 is electrically connected to fourth electrode 107 leading onto the rear surface side of semiconductor layer 101. In power generation element 7, insulating layer 104 and conductive layer 105 are provided to establish an electric connection relationship between first electrode 102 and second electrode 103 that are formed on both surfaces of semiconductor layer 101.

First electrode 102 may be made of a stacked film of an AuGe alloy, Ni, and Au, and second electrode 103 may be made of a stacked film of Ti, Pt, and Au. Third electrode 106 and fourth electrode 107 may be made of Au or Ni.

Figure 5:
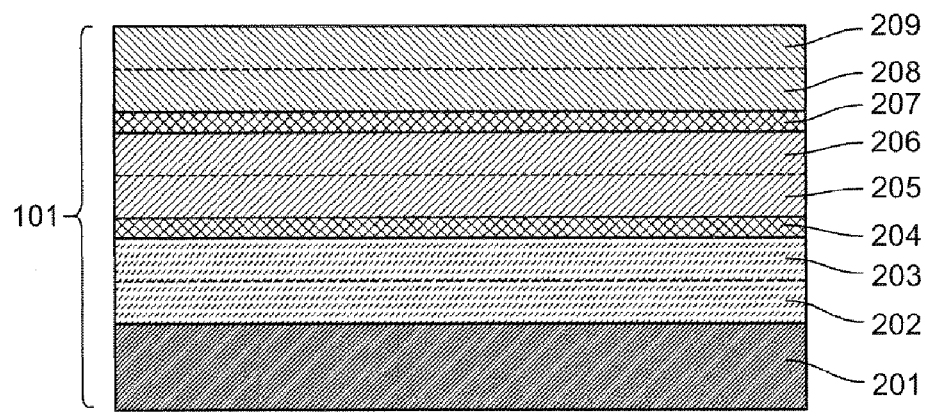
FIG. 5 is a sectional view illustrating a semiconductor layer of the power generation element in the first embodiment.

FIG. 5 illustrates an enlarged section of semiconductor layer 101 of power generation element 7 in the first embodiment. A thickness relationship (ratio) among layers in FIG. 5 does not indicate the actual thickness relationship (ratio). Referring to FIG. 5, semiconductor layer 101 is formed by stacking p-GaAs substrate 201, p-GaInNAs layer 202, n-GaInNAs layer 203, first tunnel junction layer 204, p-GaAs layer 205, n-GaAs layer 206, second tunnel junction layer 207, p-InGaP layer 208, and n-InGaP layer 209.

For example, power generation element 7 of the first embodiment has a substantially square shape and a vertical and horizontal size of 1 mm×1 mm. For example, light receiving region 100 of power generation element 7 has a substantially square shape and a vertical and horizontal size of 550 µm×550 µm. In power generation element 7 having the above sizes, because light collecting lens 5a having a substantial quadrangle in planar view is used in the light receiving unit to which the sunlight is incident, a focused spot in which the light is collected by light collecting lens 5a has a substantial rectangle, for example, the vertical and horizontal size of 400 µm×400 µm.

In the first embodiment, the light receiving unit of each power generation module 4 has the quadrangular shape in planar view. However, the light receiving unit (light receiving surface) of power generation module 4 and the light receiving unit (light receiving surface) of the light collecting element unit are not limited to the quadrangular shape, but may be formed into a polygonal shape or a circular shape.

Figure 6:
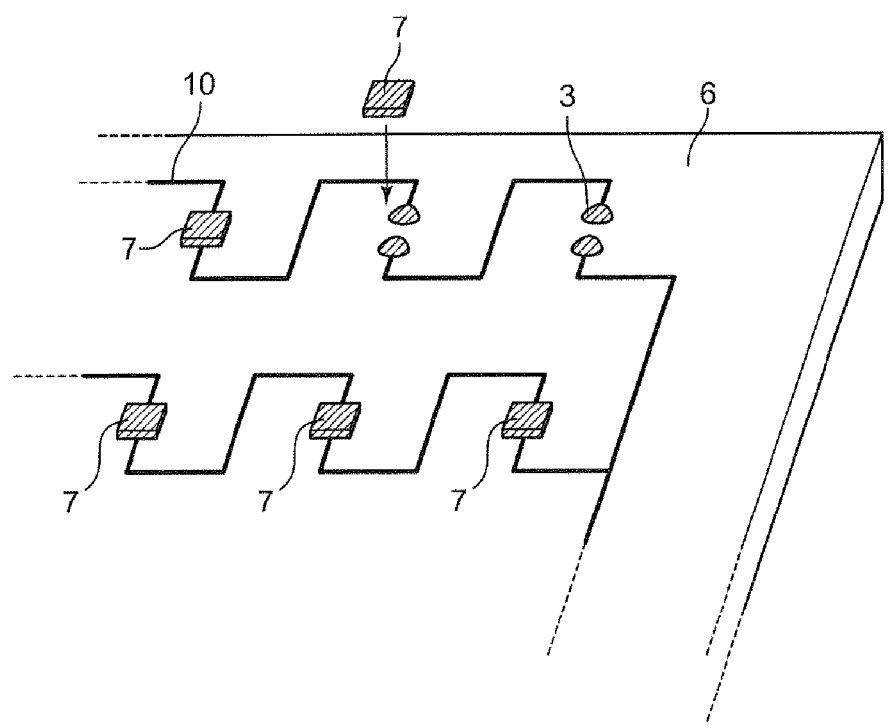
FIG. 6 is a view schematically illustrating a method for mounting the power generation element on a wiring board in the first embodiment.

FIG. 6 is a view schematically illustrating a method for mounting power generation element 7 of power generation module 4 on wiring board 6. As illustrated in FIG. 6, power generation element 7 is mounted on wiring board 6 that is formed by previously providing wiring 10 on a glass epoxy board. In wiring board 6 in which wiring 10 is previously provided, solder paste (Sn—Ag—Bi—Cu) 3 is applied to a connection unit. The connection unit is located at a position, where power generation element 7 is mounted and a p-electrode and an n-electrode of power generation element 7 are connected to each other. Wiring board 6 is heated to a melting point of solder paste 3 or more, and power generation elements 7 are sequentially mounted at predetermined positions on wiring board 6 by a chip mounter.

[Solar Position Detection System]

A solar position detection system that detects a solar position in the concentrating photoelectric conversion device of the first embodiment will be described below.

In a power generation circuit (solar cell) constructed with the plurality of power generation elements, current values of the power generation elements are equal to one another in a series-circuit configuration. In this case, the current value of the series circuit is limited to the current value of the power generation element that generates a minimum current amount. A voltage value of the series circuit becomes a sum of voltages of the power generation elements in the series circuit. Accordingly, both the current value and voltage value of the power generation element decrease in the case where the focused spot is shifted from the light receiving region of the power generation element (in the case where a position shift is generated). Therefore, the current amount of the series circuit is limited to the current value of the power generation element in which the focused spot is shifted, and the voltage value of the series circuit decreases by the decrease in voltage of the power generation element in which the focused spot is shifted.

In the whole power generation circuit formed by connecting the plurality of series circuits in parallel, the current value of the whole generation circuit becomes the sum of current values of the plurality of series circuits. On the other hand, the voltage value of the whole power generation circuit is limited to the minimum voltage value of the series circuit.

The solar cell is operated on a condition that current× voltage is maximized in the whole power generation circuit. Accordingly, in the case where the focused spot is shifted in one of the power generation elements, an operating current value and an operating voltage value of the series circuit including the power generation element change, and an operating current value and an operating voltage value of the whole power generation circuit also change.

In the first embodiment, the solar position detection system is constructed using phenomena of the changes of the voltage value and current value that are generated when the focused spot is shifted.

The power generation amount of the power generation element decreases when the focused spot is shifted, which results in a problem in that the power generation amount of the whole power generation circuit decreases. However, in the configuration of the first embodiment, only some power generation elements in the many power generation elements constituting the whole power generation circuit is used as the position shift detection element used in the solar position detection system, and the large decrease in power generation amount is constrained as the whole power generation circuit.

FIG. 7A is a sectional view illustrating one light collecting element unit including normal power generation element (normal photoelectric conversion element) 7n that is of power generation element 7 having a function of converting the sunlight into the power. FIG. 7B is a sectional view illustrating one light collecting element unit including position shift detection element 7s having not only the function of converting the sunlight into the power but also a function of detecting the solar position. As illustrated in FIG. 7B, in a structure of the light collecting element unit including position shift detection element 7s, voltage measuring terminal 9 is provided in wiring board 6, and a voltage signal of position shift detection element 7s can be taken out to the outside from the back of wiring board 6. The normal photoelectric conversion element has a center position of the light receiving region. The center position of the light receiving region coincides with a center position of the light collecting region that is of the region through which the collected light passes. The center position of the light receiving region of the normal photoelectric conversion element may be a position away from the center position of the light collecting region by a first predetermined distance. Examples of the predetermined distance include the length depending on a production error of the light collecting lens and the length depending on a production error of the power generation element. The position shift detection element has a center position of the light receiving region at a position away from a center position of the light collecting region (also referred to as the focused spot), which is of the region through which the collected light passes, by a second predetermined distance. The position shift detection elements having centers of the light receiving regions at positions shifted upward, downward, rightward and leftward from the center position of the light collecting region are also referred to as a first position shift detection element, a second position shift detection element, a third position shift detection element, and a fourth position shift detection element. A plurality of detection elements including the first position shift detection element, the second position shift detection element, the third position shift detection element, and the fourth position shift detection element are also referred to as position shift detection element group 7S. The second predetermined distance is described later.

In the following description of position shift detection method in the solar position detection system, power generation element 7 having the function of converting the sunlight into the power is referred to as normal power generation element (normal photoelectric conversion element) 7n, and power generation element 7 having not only the function of converting the sunlight into the power but also the function of detecting the position shift shifted from the solar orbit is referred to as position shift detection element 7s.

FIGS. 8A-8E are views illustrating a state where light receiving regions 100 of four position shift detection elements 7s in the concentrating photoelectric conversion device of the first embodiment are disposed so as to be opposite to the sun, and FIG. 8A-8E illustrates the state where position shift is not generated. FIG. 8A illustrates position shift detection element 7s as first position shift detection element 7A that detects the position shift in the upward direction. Similarly, FIG. 8B illustrates position shift detection element 7s as second position shift detection element 7B that detects the position shift in the downward direction, FIG. 8C illustrates position shift detection element 7s as third position shift detection element 7C that detects the position shift in the rightward direction, and FIG. 8D illustrates position shift detection element 7s as fourth position shift detection element 7D that detects the position shift in the leftward direction. FIG. 8E illustrates the state where normal power generation element 7n is disposed at a correct position opposite to the sun. In the first embodiment, first, second, third, and fourth position shift detection elements 7A, 7B, 7C, and 7D that detect the position shift in the upward, downward, rightward, and leftward directions are referred to as position shift detection element group 7S.

In power generation elements 7s and 7n of FIGS. 8A-8E, focused spot 300 of the sunlight is disposed in light receiving region 100, light receiving region 100 is irradiated with focused spot 300, and power generation elements 7s (7A, 7B, 7C, and 7D) and 7n generate a certain power generation amount. In FIGS. 8A-8E, an intersection of alternate long and short dash lines indicates the center position of focused spot 300 in the case where the position shift is not generated in normal power generation element 7n.

As illustrated in FIGS. 8A-8E, the center of light receiving region 100 of each of position shift detection elements 7s (7A, 7B, 7C, and 7D) in position shift detection element group 7S is disposed so as to be shifted from the center position (the position of the intersection of the alternate long and short dash lines in FIGS. 8A-8E) of focused spot 300 in absence of the position shift. However, in absence of position shift, focused spot 300 is surely disposed in light receiving region 100 of each of position shift detection elements 7s (7A, 7B, 7C, and 7D), and all position shift detection elements 7s (7A, 7B, 7C, and 7D) are located in the state contributing to the power generation.

[Position Shift Detection Method]

FIGS. 9A-9E are a view illustrating position shift detection elements 7s (7A, 7B, 7C, and 7D) and normal power generation element 7n when the position of a focused spot 300 is shifted upward. In FIGS. 9A-9E, similarly to FIGS. 8A-8E, light receiving regions 100 of position shift detection element 7s (7A, 7B, 7C, and 7D) in position shift detection element group 7S is irradiated with focused spot 300.

As illustrated in FIGS. 9A-9E, in the case where the position of focused spot 300 is shifted in the upward direction, focused spot 300 stray from light receiving region 100 only in first position shift detection element 7A that detects the position shift in the upward direction. As a result, the shift of focused spot 300 in the upward direction with respect to light receiving region 100 can be detected because only output voltage of first position shift detection element 7A decreases.

The output voltages of second position shift detection element 7B, third position shift detection element 7C, and fourth position shift detection element 7D are detected and compared to a reference output voltage, which allows the position shifts to be also detected in the downward, rightward, and leftward directions.

FIGS. 10A-10E are a view illustrating position shift detection elements 7s (7A, 7B, 7C, and 7D) and normal power generation element 7n in the case where the position of focused spot 300 is shifted in the upward rightward direction. As illustrated in FIG. 10A-10E, in first position shift detection element 7A (FIG. 10A) and third position shift detection element 7C (FIG. 10C), focused spot 300 strays from light receiving region 100 in the upward and rightward directions. Accordingly, the decrease in voltage is detected by voltage measuring terminals 9 of first position shift detection element 7A and third position shift detection element 7C, which allows the position of focused spot 300 to be shifted in the upward rightward direction. Similarly, the position shift can be detected in oblique directions such as a downward rightward direction, an upward leftward direction, and a downward leftward direction.

Assuming that $V_A$, $V_B$, $V_C$, and $V_D$ are detection voltages of position shift detection elements 7s (7A, 7B, 7C, and 7D) in position shift detection element group 7S, and that $V_E$ is a detection voltage of normal power generation elements 7n connected in series to position shift detection element 7s, for example, specific detection methods are indicated in TABLE 1.

TABLE 1

| Direction in which focused spot is shifted | First detection method | Second detection method |
|---|---|---|
| Upward | $V_A - V_B < 0$ | $V_A - V_E < 0$ |
| Downward | $V_A - V_B > 0$ | $V_B - V_E < 0$ |
| Rightward | $V_C - V_D < 0$ | $V_C - V_E < 0$ |
| Leftward | $V_C - V_D > 0$ | $V_D - V_E < 0$ |
| Upward rightward | $V_A - V_B < 0$ and $V_C - V_D < 0$ | $V_A - V_E < 0$ and $V_C - V_E < 0$ |
| Downward rightward | $V_C - V_D < 0 < V_A - V_B$ | $V_B - V_E < 0$ and $V_C - V_E < 0$ |
| Upward leftward | $V_A - V_B < 0 < V_C - V_D$ | $V_A - V_E < 0$ and $V_D - V_E < 0$ |
| Downward leftward | $0 < V_A - V_B$ and $0 < V_C - V_D$ | $V_B - V_E < 0$ and $V_D - V_E < 0$ |

As illustrated in TABLE 1, for example, there are two position shift detection methods. In a first detection method, the position shift is detected by detecting voltage differences ($V_A-V_B$) and ($V_C-V_D$) of position shift detection elements 7s that detect the position shifts in the direction opposite to each other. Specifically, the position shift in the upward direction can be detected when detection voltage $V_A$ of first position shift detection element 7A is larger than detection voltage $V_B$ of second position shift detection element 7B. On the other hand, the position shift in the downward direction can be detected when detection voltage $V_A$ of first position shift detection element 7A is smaller than detection voltage $V_B$ of second position shift detection element 7B. As illustrated in TABLE 1, the position shifts in other directions can be detected when a positive or negative state larger than or equal to a reference value is detected in voltage differences ($V_A-V_B$) and ($V_C-V_D$). Accordingly, the first detection method is a method for detecting the position shift using only the detection voltages of four position shift detection elements 7s.

In a second detection method, detection voltage $V_E$ of normal power generation element 7n connected in series to position shift detection element group 7S is used as a reference voltage, and detection voltages $V_A$, $V_B$, $V_C$, and $V_D$ of position shift detection elements 7s are compared to the reference voltage. Accordingly, the second detection method is a method for detecting the position shift using the five detection voltages of four position shift detection elements 7s and one normal power generation element 7n.

Both the first and second detection methods are the method for detecting the position shift by the voltage difference between power generation elements 7 that are provided in the substantially same region in power generation panel 1 to indicate the position shifts in the directions opposite to each other. Therefore, in the first and second detection methods, even if an amount of directly reaching solar radiation changes in each region of the light receiving surface in the power generation panel 1, because the similar change is generated in power generation element 7 (7s), the change hardly affects the detection voltage.

FIG. 11 illustrates wiring board 6 on which position shift detection element group 7S is mounted in the case where the first detection method is adopted, and illustrates wiring board 6 to which normal power generation element 7n and position shift detection element group 7S, which are of power generation element 7 in position shift detection series circuit 80, are attached. FIG. 11A is a plan view illustrating a mounting surface of wiring board 6, and FIG. 11B is a sectional view taken along the line 11B-11B of wiring board 6 in FIG. 11A. As illustrated in FIG. 11, voltage measuring terminal 9 is connected to each of four position shift detection element 7s (7A, 7B, 7C, and 7D) in position shift detection element group 7S. Voltage measuring terminal 9 pierces wiring board 6 such that a voltage signal can be taken out from the surface on the side opposite to the surface on which wiring 10 of wiring board 6 is routed. Connection terminals 13 are provided in both end portions of wiring board 6 in order to electrically connect power generation modules 4.

FIG. 12 illustrates wiring board 6 on which position shift detection element group 7S and reference normal power generation element 7n are mounted in the case where the second detection method is adopted, and illustrates wiring board 6 to which normal power generation element 7n and position shift detection element group 7S, which are of power generation element 7, are attached. FIG. 12A is a plan view illustrating the mounting surface of wiring board 6, and FIG. 12B is a sectional view taken along the line 12B-12B of wiring board 6 in FIG. 12A. As illustrated in FIG. 12, voltage measuring terminals 9 are connected to one normal power generation element 7n and each of four position shift detection elements 7s (7A, 4B, 7C, and 7D) in position shift detection series circuit 80. Voltage measuring terminal 9 pierces wiring board 6 such that a voltage signal can be taken out from the surface on the side opposite to the surface on which wiring 10 of wiring board 6 is routed. Connection terminals 13 are provided in both end portions of wiring board 6 in order to electrically connect power generation modules 4.

As illustrated in FIG. 2, in wiring board 6 on which power generation element 7 is mounted, lens array 5 is bonded using a transparent adhesive such as silicone resin to produce power generation module 4. Elements such as wiring 10, voltage measuring terminal 9, and connection terminal 13 on wiring board 6 are not illustrated in FIG. 2. Power generation modules 4 are fixed by screwing or bonding while arrayed in the planar manner on frame 8 of power generation panel 1 (see FIG. 3). At this point, power generation modules 4 are connected in series or parallel by connection terminal 13 according to the specification, thereby forming the whole power generation circuit of power generation panel 1.

[Sun Tracking System]

Figure 13:
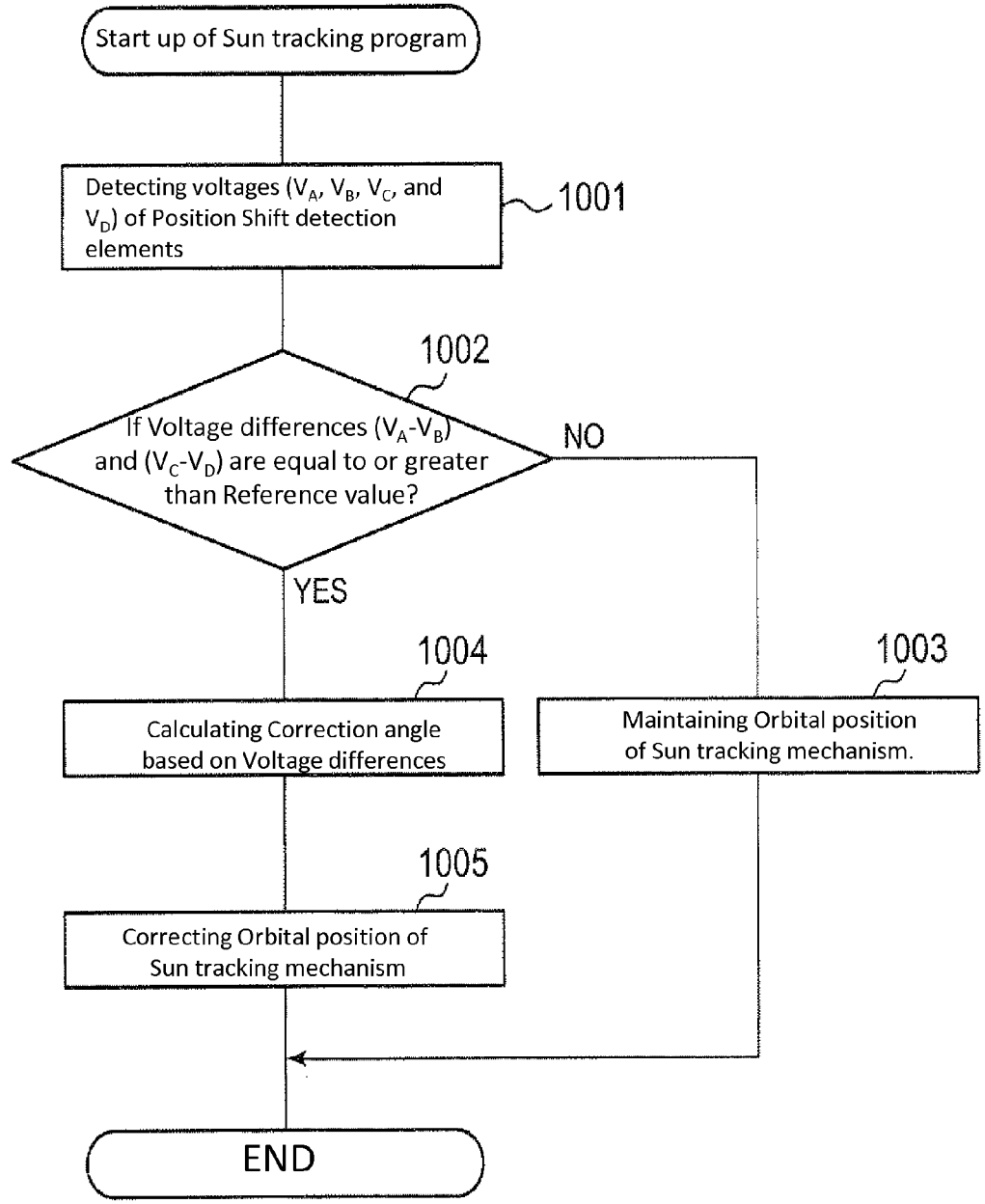
FIG. 13 is a flowchart of a sun tracking system in a first detection method in the concentrating photoelectric conversion device of the first embodiment.

FIG. 13 is a flowchart of the sun tracking system in the first detection method for detecting the position shift in the concentrating photoelectric conversion device of the first embodiment to correct the position of the sun tracking orbit. In the sun tracking system, a controller provided in the concentrating photoelectric conversion device performs drive control of sun tracking mechanism 2a including two (X-axis and Y-axis) rotating axes based on information on the detection voltage of each position shift detection element 7s.

When a sun tracking program is activated, voltages ($V_A$, $V_B$, $V_C$, and $V_D$) of position shift detection elements 7s (7A, 7B, 7C, and 7D) in position shift detection element group 7S is detected in Step 1001.

Whether each of first voltage difference ($V_A-V_B$) between position shift detection element 7A in the upward direction of position shift detection element group 7S and position shift detection element 7B in the downward direction and second voltage difference ($V_C-V_D$) between position shift detection element 7C in the rightward direction and position shift detection element 7D in the leftward direction is greater than or equal to the reference value is detected in Step 1002. At this point, the reference value is decided by obtaining a relationship between the shift angle and the voltage difference through an experiment. In the reference value, desirably the voltage difference ranges from 20 mV to 30 mV, and the shift angle is set to about 0.25°.

When both voltage differences ($V_A-V_B$) and ($V_C-V_D$) are less than the reference value in Step 1002, the orbital position of the sun tracking mechanism is maintained (Step 1003).

On the other hand, when at least one of voltage differences ($V_A-V_B$) and ($V_C-V_D$) is greater than or equal to the reference value in Step 1002, the sun tracking direction is decided according to the positive or negative state of the voltage differences ($V_A-V_B$) and ($V_C-V_D$) of the first detection method in TABLE 1, and a correction angle of the position shift is calculated according to the voltage difference (Step 1004).

The orbital position of the sun tracking mechanism 2a is corrected according to the calculated correction angle in Step 1005. Then the sun tracking program by the first detection method is ended.

Sun tracking mechanism 2a in the first embodiment is a system that tracks the solar orbit by turning control in two axial directions (X-axis and Y-axis), the turning control of the X-axis is performed by first voltage difference ($V_A$-$V_B$) between position shift detection element 7A in the upward direction and position shift detection element 7B in the downward direction, and the turning control of the Y-axis is performed by second voltage difference ($V_C$-$V_D$) between position shift detection element 7C in the rightward direction and position shift detection element 7D in the leftward direction.

Figure 14:
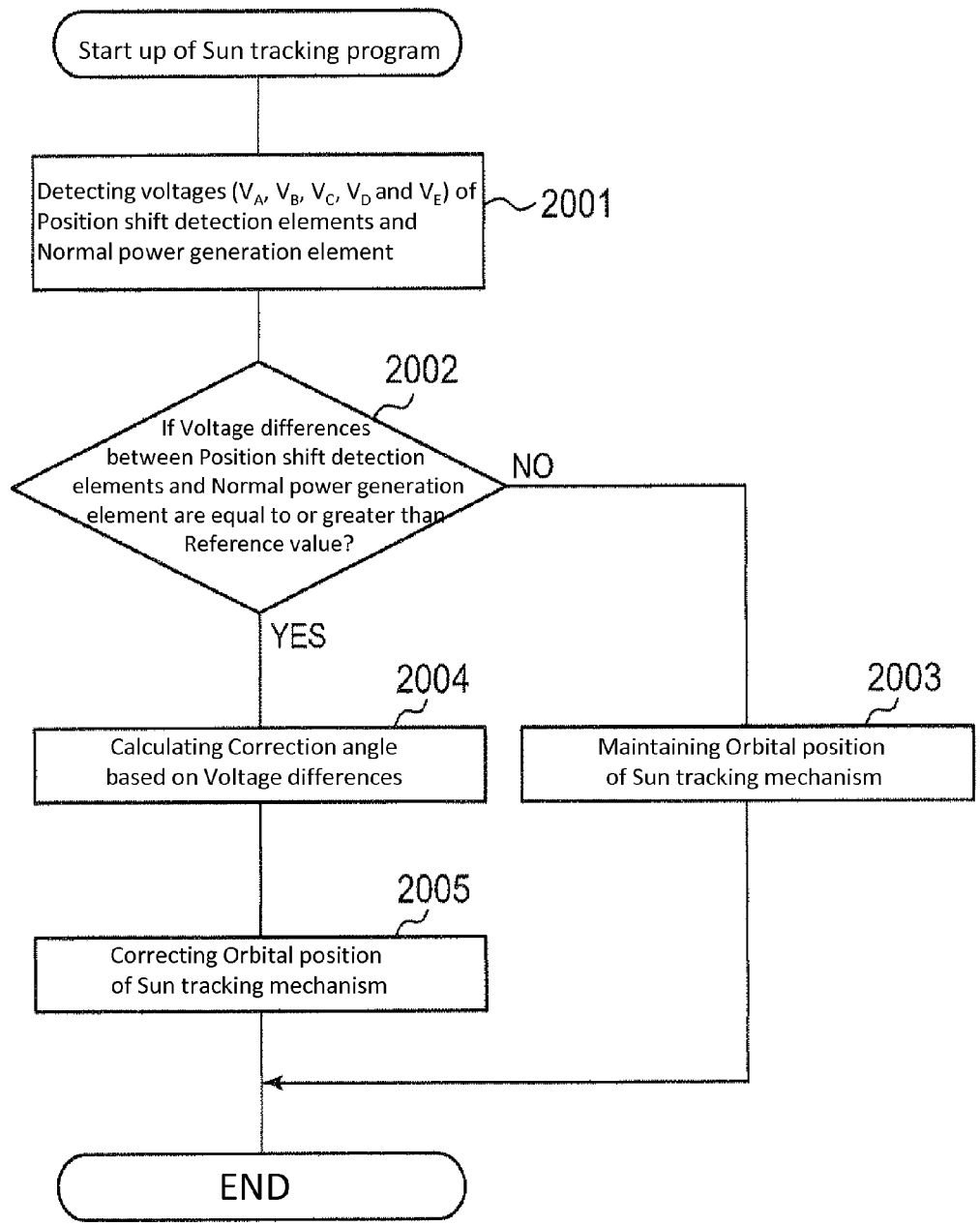
FIG. 14 is a flowchart of the sun tracking system in a second detection method in the concentrating photoelectric conversion device of the first embodiment.

The flowchart in FIG. 13 is the sun tracking program by the first detection method in TABLE 1, and the flowchart in FIG. 14 is the sun tracking program by the second detection method in TABLE 2. In the sun tracking system that performs the sun tracking program, the controller provided in the concentrating photoelectric conversion device performs the drive control of sun tracking mechanism 2a including the two (X-axis and Y-axis) rotating axes based on the information on the detection voltage of each position shift detection element 7s and the information on the detection voltage of normal power generation element 7n.

As illustrated in FIG. 14, voltages ($V_A$, $V_B$, $V_C$, and $V_D$) of position shift detection elements 7s (7A, 7B, 7C, and 7D) and voltage ($V_E$) of normal power generation element 7n connected to the same series circuit are detected in Step 2001.

Whether voltage differences ($V_A$-$V_E$), ($V_B$-$V_E$), ($V_C$-$V_E$), and ($V_D$-$V_E$) between position shift detection elements 7s and normal power generation element 7n are greater than or equal to the reference value is detected in Step 2002.

When all the voltage differences are less than the reference value in Step 2002, the orbital position of the sun tracking mechanism 2a is maintained (Step 2003).

On the other hand, when at least one of voltage differences ($V_A$-$V_E$), ($V_B$-$V_E$), ($V_C$-$V_E$), and ($V_D$-$V_E$) is greater than or equal to the reference value in Step 2002, the tracking direction is decided according to the positive or negative state of the voltage difference of the second detection method in TABLE 1, and the correction angle of the position shift is calculated according to the voltage difference (Step 2004).

The orbital position of the sun tracking mechanism 2a is corrected according to the calculated correction angle in Step 2005. Then the sun tracking program by the second detection method is ended.

[Method for Correcting Orbit of Sun Tracking Mechanism]

A method for correcting the orbital position of sun tracking mechanism 2a by voltage difference ΔV detected during the generation of the position shift will be described below.

FIG. 15 is a view illustrating a relationship between an angle of the sunlight and the position shift of focused spot 300 when the sunlight is incident on the light collecting element unit. FIG. 15A is a view illustrating a positional relationship between light receiving region 100 and focused spot 300 in power generation element 7 when the position shift is not generated. FIGS. 15B to 15E are sectional views schematically illustrating the light collecting element unit of power generation module 4 including light collecting lens 5a, power generation element 7, and wiring board 6.

In the following description, as illustrated in FIG. 15A, it is assumed that $W_1$ is horizontal and vertical lengths of light receiving region 100 of power generation element 7, and that $W_2$ is horizontal and vertical lengths of focused spot 300. Specifically, for example, $W_1$ is set to 550 μm and $W_2$ is set to 400 μm.

FIG. 15B illustrates the position of focused spot 300 in light receiving region 100 power generation element 7 in the case where the position shift is not generated, and FIG. 15C illustrates a state where the sunlight moves to shift focused spot 300 to a limit of light receiving region 100 of power generation element 7.

In the case where the position shift is not generated, when power generation element 7 is installed such that the center of the focused spot 300 becomes the center of light receiving region 100 of power generation element 7, shift amount D of the limit at which focused spot 300 is shifted to start to stray from light receiving region 100 is given by the following equation (1).

$$D=(W_1-W_2)/2 \tag{1}$$

That is, D=75 μm is obtained in the above example.

FIG. 15D illustrates a state where, when position shift detection element 7s is used as power generation element 7, position shift detection element 7s is installed such that the position shifted from the center of focused spot 300 by distance s becomes the center of light receiving region 100 of power generation element 7 in absence of the position shift. FIG. 15E illustrates a state where the sunlight moves to shift focused spot 300 to the limit of light receiving region 100 of position shift detection element 7s.

In position shift detection element 7s of FIG. 15D, shift amount Ds of the limit at which focused spot 300 is shifted to start to stray from light receiving region 100 is given by the following equation (2).

$$Ds=(W_1-W_2)/2 \tag{2}$$

That is, assuming that shifted distance s is 35 μm, Ds=40 μm is obtained in the above example.

Assuming that h is a height of light collecting lens 5a, incident shift angle $\theta_2$ of the sunlight in light collecting lens 5a of lens array 5 is expressed by the following equation (3).

$$\theta_2=\tan^{-1}(Ds/h) \tag{3}$$

Assuming that n is a refractive index of lens array 5, incident shift angle $\theta_1$ of the sunlight incident on light collecting lens 5a of lens array 5 is expressed by the following equation (4) for shift amount Ds of the limit at which focused spot 300 is shifted to start to stray from light receiving region 100.

$$\theta_1=\sin^{-1}(n \times \sin \theta_2) \tag{4}$$

In the case where focused spot 300 strays from light receiving region 100 to reach shift amount D', assuming that $\theta_2$' is an incident shift angle of the sunlight in light collecting lens 5a at that time, incident shift angle $\theta_1$' of the sunlight incident on light collecting lens 5a of lens array 5 is expressed by the following equations (5) and (6).

$$\theta_2=\tan^{-1}(Ds/h) \tag{5}$$

$$\theta_1=\sin^{-1}(n \times \sin \theta_2) \tag{6}$$

TABLE 2

| Focused spot shift amount (%) | ΔV (V) | (Whole) current (A) | (Whole) voltage (V) | (Whole) power generation amount (W) | Ratio of power generation amount | Shift angle (°) |
|---|---|---|---|---|---|---|
| 0.0 | 0.000 | 0.09618 | 13.720 | 1.319 | 1.0000 | 0.201 |
| 10. | −0.012 | 0.09600 | 13.728 | 1.318 | 0.9989 | 0.236 |
| 2.0 | −0.024 | 0.09620 | 13.696 | 1.318 | 0.9987 | 0.261 |
| 3.0 | −0.044 | 0.09622 | 13.696 | 1.318 | 0.9989 | 0.281 |
| 4.0 | −0.068 | 0.09609 | 13.720 | 1.318 | 0.9993 | 0.301 |

TABLE 2 illustrates an example of a calculation result of a relationship among the shift amount (focused spot shift amount) of focused spot 300, the decrease in power generation amount of the whole power generation circuit, and the shift angle (incident shift angle) necessary to correct the shift for the purpose of the sun tracking in the case where the position shift (shift of focused spot) is generated in position shift detection element 7s. The focused spot shift amount is indicated by an area ratio straying from light receiving region 100 in a spot surface of focused spot 300. The focused spot shift amount is calculated by (D'−D)/W$_2$. The power generation circuit used in the calculation is formed by 10 parallel circuits in each of which the series circuit is constructed with five power generation elements 7.

$W_1$=550 μm, $W_2$=400 μm, s=35 μm, h=17 mm, and n=1.49 are used as parameters used in the calculation. The configuration of the element in FIG. 7B is used as position shift detection element 7s that is of power generation element 7.

As illustrated in TABLE 2, it can be understood that the power generation amount is hardly decreased in the whole power generation circuit even if the position shift (focused spot shift) is generated. Desirably several tens of millivolts are required for voltage difference ΔV in which the position shift can stably be detected, and the position shift is detected at a smallest stage. Therefore, the focused spot shift amount of about 1% to about 2% is desirably detected from TABLE 2. As illustrated in TABLE 2, for the focused spot shift amount of 2.0%, position shift detection element 7s constituting the same series circuit had voltage difference ΔV of 24 mV. At this point, the shift angle that is of the shift correction amount of the sun tracking is 0.261 that is comparable to a movement amount per minute (about 0.25°) of the sun. Accordingly, the sun tracking program of the sun tracking system may be activated every about one minute.

An example of the distance between the center position in the light receiving region of the first position shift detection element and the center position in the light collecting region will be described below. An amount s shifted from the center of focused spot 300 satisfying the following conditions is indicated as an example of a second predetermined distance. (Condition 1) a detection angle of the position shift is 0.25° that is an angle at which the sun moved for one minute. (Condition 2) the shift amount (light amount) during the detection ranges from 1% to 2% (hereinafter, R=1% to 2%)

For the position shift of 0.25°, position shift amount D1 (distance) is expressed by the following equation (7).

$$D1 = h \times \tan(\sin^{-1}(\sin(0.25)/n)) \qquad (7)$$

On the other hand, from the limit position where focused spot 300 is shifted to start to stray from light receiving region 100, shift amount D2 (distance) in which the shift amount (light amount) becomes 1% to 2% is expressed by the following equation (8).

$$D2 = W_2 \times R \qquad (8)$$

The limit position where focused spot 300 is shifted to start to stray from light receiving region 100 satisfies equation (2) of Ds=($W_1$−$W_2$)/2−s.

Therefore, in order to satisfy (condition 1) and (condition 2), the following equation (9) can hold using equation (7), equation (8), and equation (2).

$$(W_1 - W_2)/2 - s + W_2 \times R = h \times \tan(\sin^{-1}(\sin(0.25)n)) \qquad (9)$$

When equation (9) is disposed, the shift amount at which position shift detection element 7s is shifted and installed, namely, the second predetermined distance becomes s=($W_1$−$W_2$)/2+$W_2$×R−h×tan(sin$^{-1}$(sin(0.25)/n)).

Where $W_1$ is horizontal and vertical lengths of light receiving region 100 of power generation element 7, $W_2$ is horizontal and vertical lengths of focused spot 300, h is a height of light collecting lens 5a, and n is a refractive index of the lens. For example, s=33 μm is obtained for $W_1$=550 μm, $W_2$=400 μm, h=17 mm, n=1.49, and R=2%.

[Countermeasure Against Deflection of Power Generation Panel]

When power generation panel 1 and power generation module 4 are completely flat in the panel-shape concentrating photoelectric conversion disposition, one set of position shift detection elements 7s can deal with the deflections of power generation panel 1 and power generation module 4. However, due to the deflection and a warp caused by the weight of power generation panel 1, the deflection caused by wind, and the difference in linear expansion coefficient between structural members bonded to each other, flatness of power generation panel 1 and power generation module 4 are degraded, and it is difficult to correctly detect and correct the position shift using the one set of position shift detection element 7s. Particularly, as illustrated in FIG. 2, power generation module 4 is formed by bonding lens array 5 made of PMMA and wiring board 6 made of the glass epoxy board, lens array 5 and wiring board 6 differing in the linear expansion coefficient. Therefore, the deflection, the warp, and the strain are generated by a temperature rise by the sunlight and a temperature change by seasons. Because the warp caused by the weight, the structural deflection, and/or the strain caused by the difference in linear expansion coefficient between structural members (hereinafter, simple referred to as a deflection and the like) are generated in the concentrating photoelectric conversion device formed into the panel shape by combining the plurality of power generation modules 4, it is necessary to enhance the power generation efficiency of the concentrating photoelectric conversion device in consideration of the deflection and the like.

Figure 23:
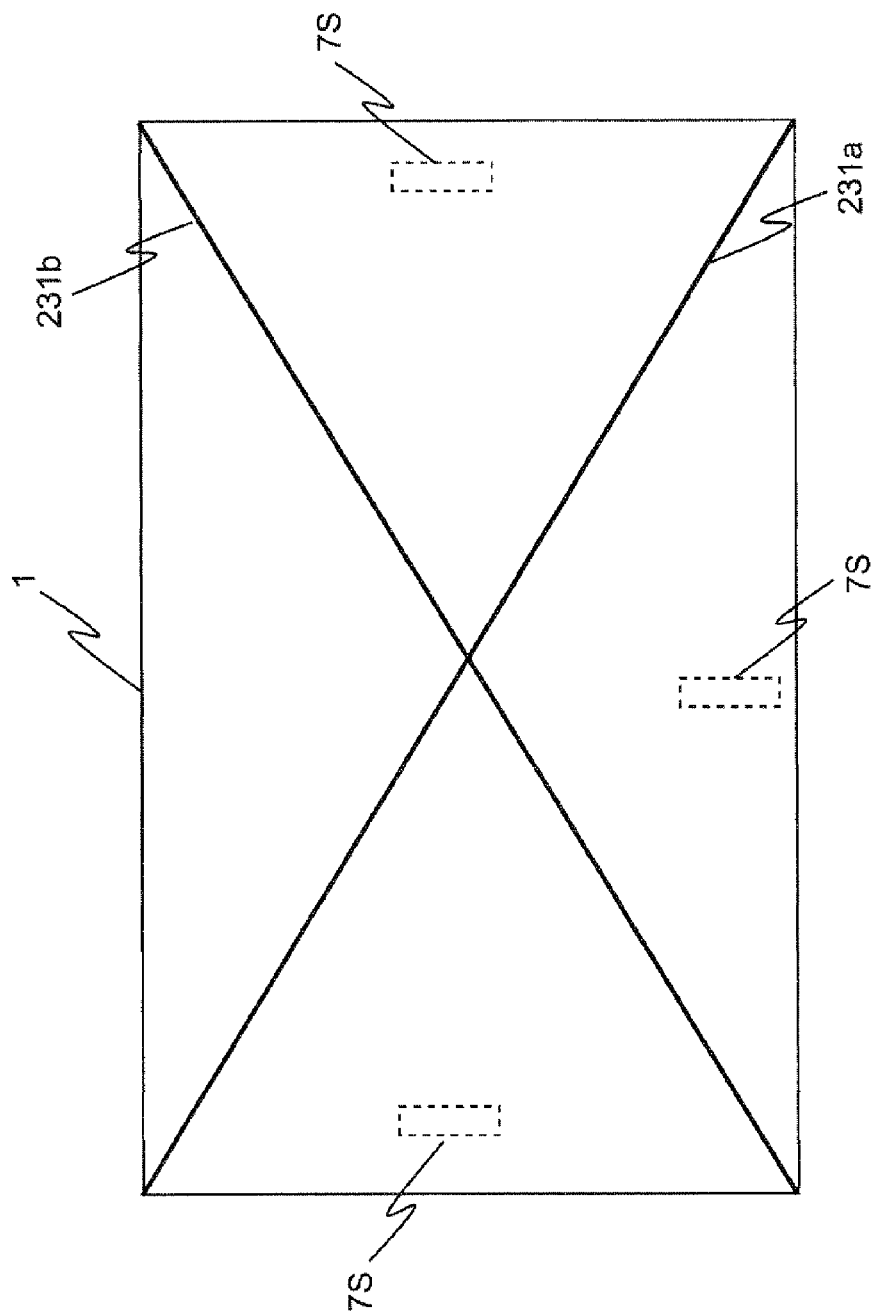
FIG. 23 is a view illustrating a disposition example of a position shift detection element group.

Therefore, in the concentrating photoelectric conversion device of the first embodiment, position shift detection elements 7s are disposed in at least three places of a main surface (principal surface) in the square panel-shape power generation panel 1 and power generation module 4. FIGS. 23 to 26 illustrate examples of position shift detection element groups 7S when the power generation panel is viewed from the top surface. In the example of FIG. 23, when power generation panel 1 is viewed from the top surface, position shift detection element groups 7S are disposed in at least three places in the four regions divided by two lines (231a and 231b) connecting opposing corners.

Figure 24:
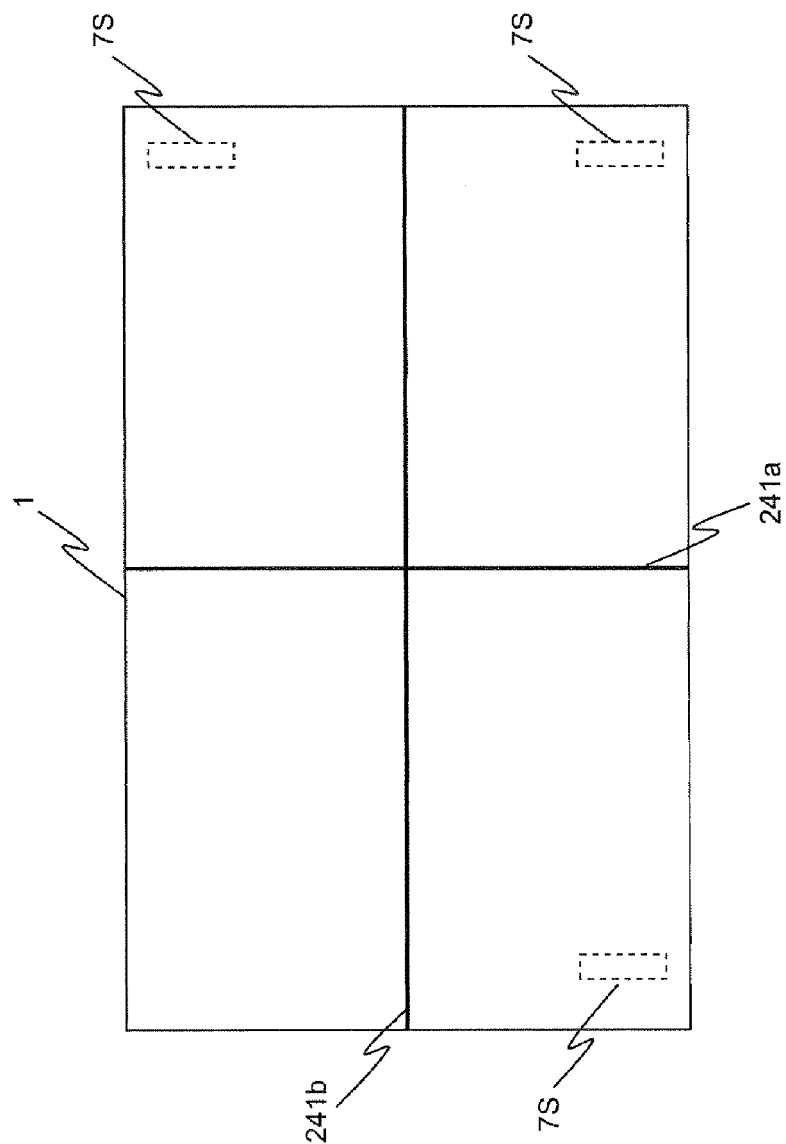
FIG. 24 is a view illustrating a disposition example of the position shift detection element group.

In the example of FIG. 24, when power generation panel 1 is viewed from the top surface, position shift detection element groups 7S are disposed in at least three places in the four regions divided by two lines (241a and 241b) connecting center positions of sides opposed to each other.

Figure 25:
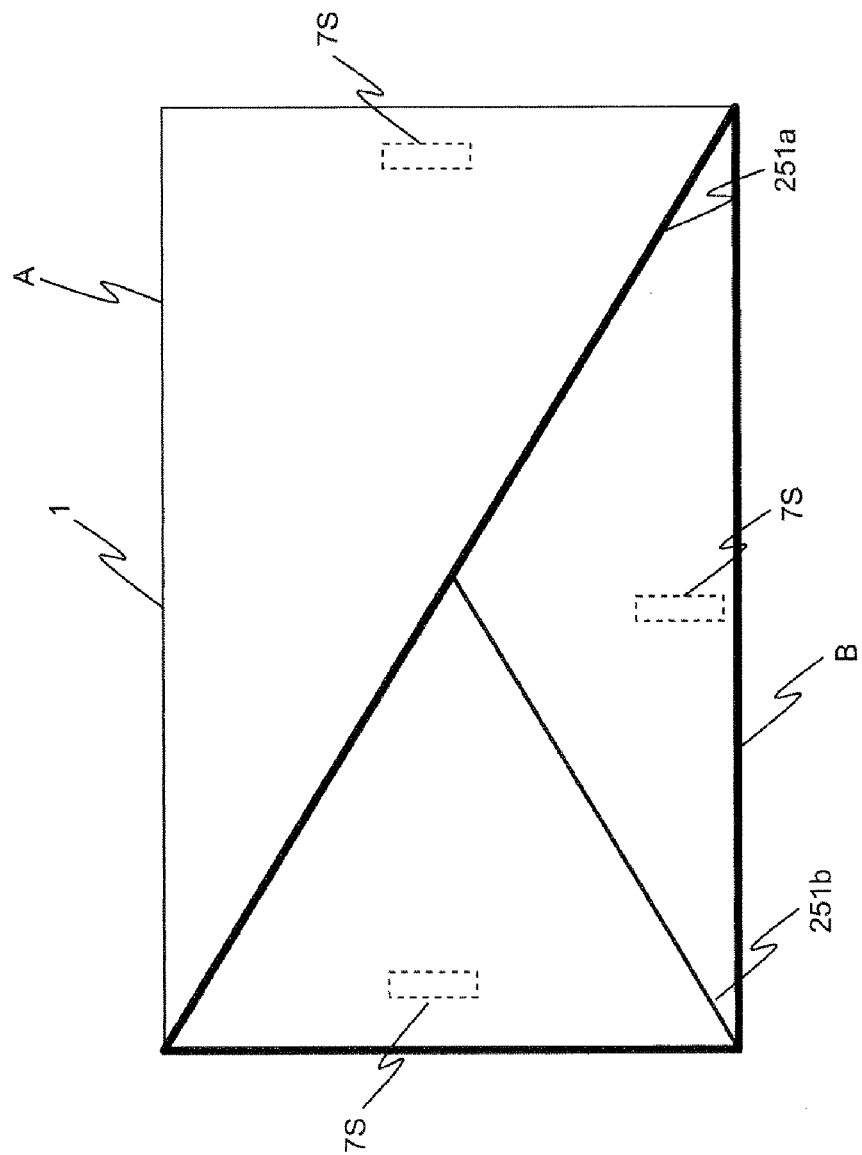
FIG. 25 is a view illustrating a disposition example of the position shift detection element group.

In the example of FIG. 25, when power generation panel 1 is viewed from the top surface, at least one position shift detection element group 7S is disposed in one (region A) of two regions (region A and region B) divided by a line (251a) connecting opposing corners. In the other region (region B), position shift detection element groups 7S are disposed in two regions divided by a line (251b) connecting the center of a diagonal line (251a) and the opposing corners.

Figure 26:
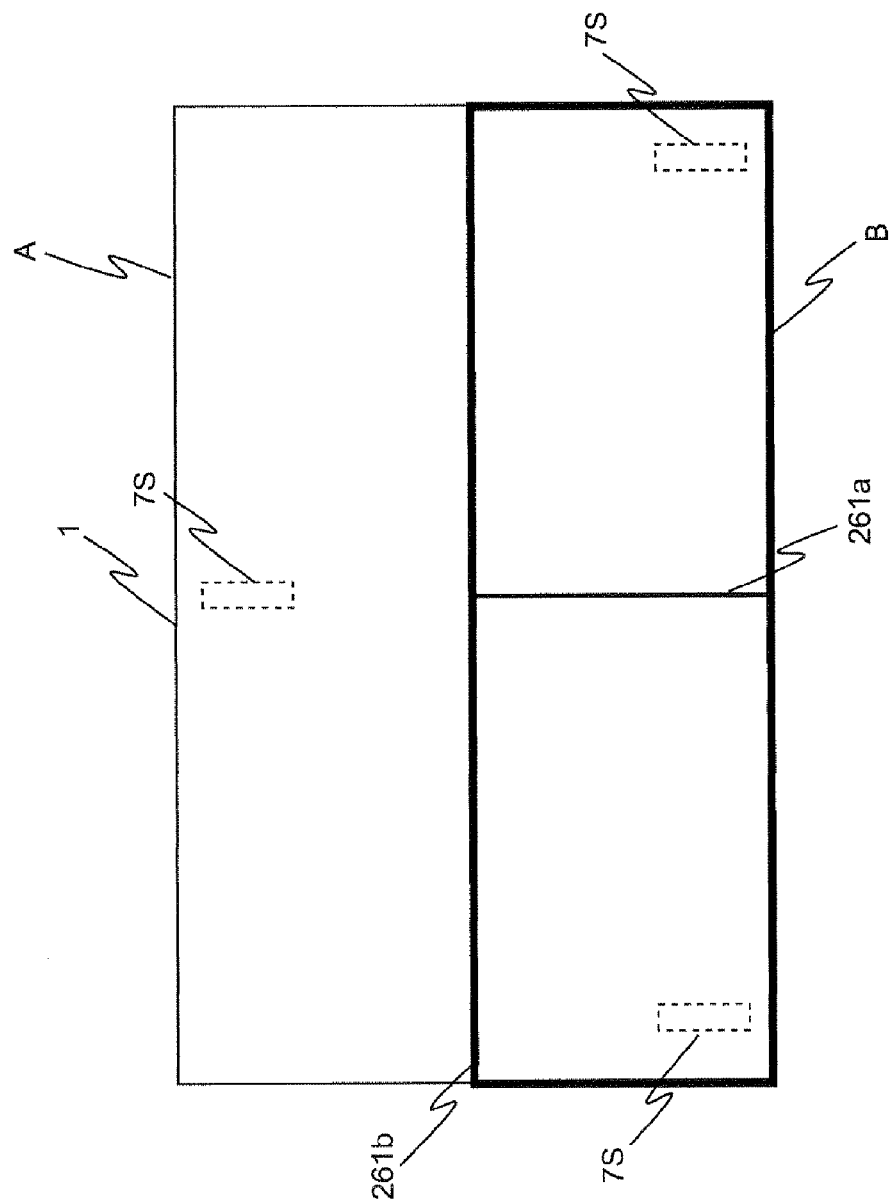
FIG. 26 is a view illustrating a disposition example of the position shift detection element group.

In the example of FIG. 26, when power generation panel 1 is viewed from the top surface, at least one position shift detection element group 7S is disposed in one (region A) of two regions (region A and region B) divided by a line (261b) connecting the center positions of the sides opposed to each other. For example, position shift detection element group 7S is disposed near the center of region A. In the other region (region B), position shift detection element groups 7S are disposed in two regions divided by a line (261b) connecting the center positions of the sides opposed to each other and a line (261a) connecting the centers of the sides opposed to each other.

Therefore, in power generation panel 1, position shift detection element group 7S can be disposed in the position where the deflection and the strain can be detected based on two axes that are easily deflected or strained.

Figure 16:
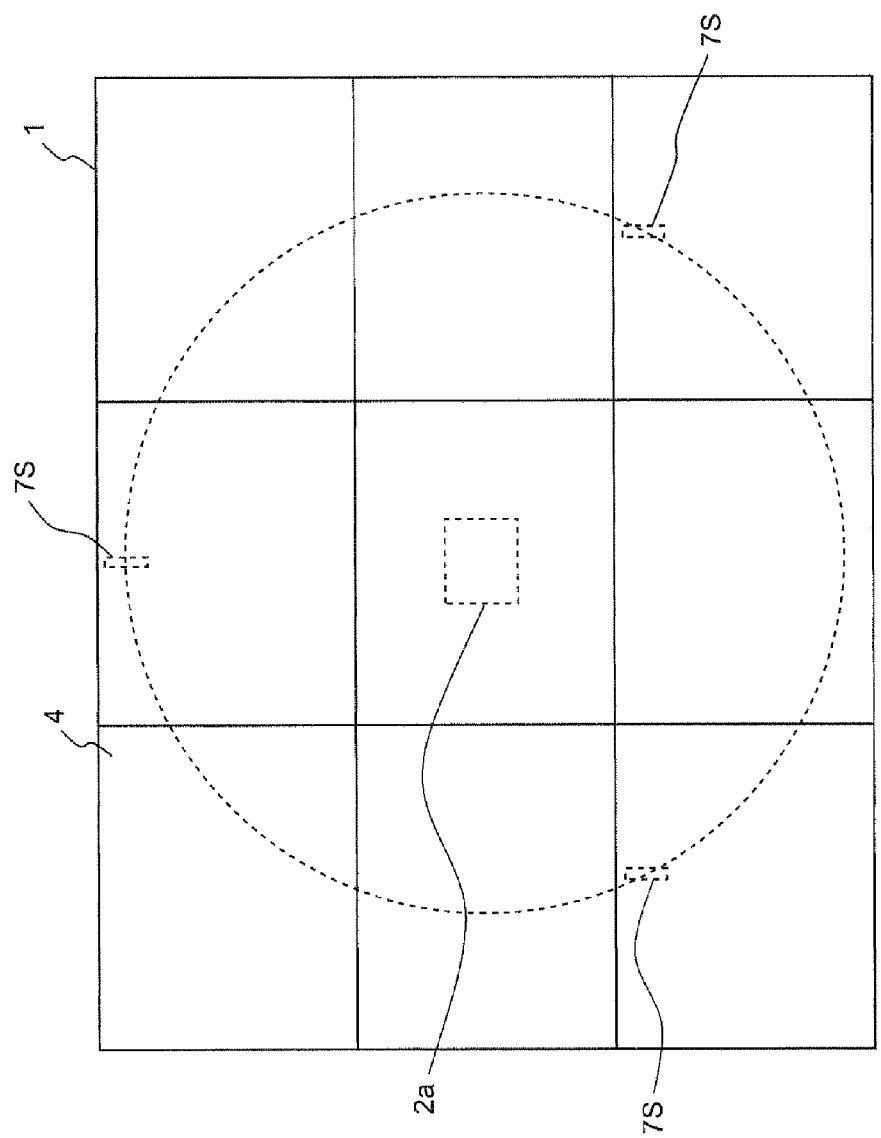
FIG. 16 is a view illustrating the case where three sets of position shift detection elements are provided in the power generation panel.

In the case where three sets of position shift detection element groups 7S are provided in power generation panel 1, for example, the three sets of position shift detection element groups 7S may concentrically be provided about a support member of support 2 that supports the substantial center (central portion) of the back of power generation panel 1, for example, a support shaft (rotating shaft extending in a vertical direction), and disposed at equal intervals. As used herein, the terms "concentrically" and "equal interval" do not mean "completely concentrically" or "completely equal distance", but includes a range where the substantially similar effect is exerted. FIG. 16 illustrates the case where the three sets of position shift detection element groups 7S are provided in power generation panel 1, and illustrates the example in which the three sets of position shift detection element groups 7S are concentrically provided on power generation panel 1 about the support shaft (rotating shaft extending in a vertical direction) of sun tracking mechanism 2a and disposed at equal intervals.

In the case where four sets of position shift detection element groups 7S are provided in power generation panel 1 in which the light receiving surface has the substantially quadrangular shape, for example, position shift detection element groups 7S are disposed in four corners in power generation panel 1 having the quadrangular light receiving portion. Therefore, the deflection and the like are detected in the four corners of power generation panel 1 farthest from the support position of support 2, and power generation panel 1 can be disposed in the highest power generation efficiency state according to the deflection and the like.

In the case where five sets of position shift detection element group 7S are provided in power generation panel 1, for example, position shift detection element groups 7S are disposed in the four corners in power generation panel 1 having the quadrangular light receiving portion, and one set of position shift detection element group 7S is provided in the position corresponding to the support position (for example, the central portion) of the support member of support 2 in power generation panel 1. Therefore, detection accuracy can be enhanced with respect to the state of the deflection and the like of power generation panel 1, and power generation panel 1 can more accurately be disposed to obtain the concentrating photoelectric conversion device having the high power generation efficiency.

In the configuration of the first embodiment, position shift detection element groups 7S are disposed in at least three places in power generation panel 1. Alternatively, position shift detection element groups 7S may similarly be disposed in at least three places in power generation module 4. When power generation panel 1 is formed using power generation module 4 having the similar configuration, the position shift can be detected at the desired position in power generation panel 1, and power generation module 4 can be dealt with power generation panels 1 having various shapes.

[Disposition Configuration of Position Shift Detection Element in Power Generation Module]

FIG. 17 is a circuit diagram illustrating a configuration example in which the plurality of position shift detection element groups 7S are provided in the power generation circuit of power generation module 4. In FIG. 17, power generation element 7 is expressed by a diode, and position shift detection element group 7S (7A, 7B, 7C, and 7D) is expressed by an outlined diode. FIG. 17A illustrates an example in which three sets of position shift detection element groups 7S are provided in the power generation circuit of power generation module 4, FIGS. 17B and 17C illustrate examples in which four sets of position shift detection element groups 7S are provided in the power generation circuit of power generation module 4, and FIG. 17D illustrates an example in which five sets of position shift detection element groups 7S are provided in the power generation circuit of power generation module 4.

As illustrated in FIG. 17, in the configuration of the first embodiment, only one set of position shift detection element group 7S (7A, 7B, 7C, and 7D) is provided with respect to one series circuit in the power generation circuit, but at least two sets of position shift detection element groups 7S are not installed in one series circuit. This is because, in series circuit (position shift detection series circuit 80) including position shift detection element 7s, voltage difference $\Delta V$ is measured at the current value as close as possible to the current value passed through another series circuit (normal power generation element series circuit 7C) constructed with the same as the number of normal power generation elements (normal power generation elements; normal photoelectric conversion elements) 7.

In power generation module 4 of FIG. 17A, the sets of position shift detection element groups 7S are disposed in three places, namely, both lower sides and the upper center in the power generation circuit. By providing the three sets of position shift detection element groups 7S in power generation module 4, the position shift of the principal surface of power generation module 4 can be detected while at least the position of the principal surface of power generation module 4 is defined.

In the concentrating photoelectric conversion device of the first embodiment, the number of sets and the disposition position of position shift detection element groups 7S in power generation module 4 are properly changed according to the specification and configuration of the concentrating photoelectric conversion device. Configuration examples in which four and five sets of position shift detection element groups 7S are disposed will be described below.

In power generation modules 4 of FIGS. 17B and 17C, the four sets of position shift detection element group 7S are disposed in four corners of power generation circuit, respectively. However, in the power generation circuit of FIG. 17C, because position shift detection element groups 7S in the four corners are disposed so as to be located at the positions of the outermost series circuits, position shift detection series circuits 80 provided in two rows on both sides are intersected. Through the above wiring, each set of position shift detection element group 7S is located at the outermost position in power generation module 4, and the disposition conditions become identical in position shift detection series circuits 80.

FIG. 17D illustrates an example in which, in the configuration of FIG. 17B, position shift detection element group 7S is provided in the central portion of power generation module 4. In the configuration of FIG. 17C, position shift detection element group 7S may be provided in the central portion of power generation module 4.

Using power generation module 4 having the above configuration, namely, at least three sets of position shift detection element groups 7S in power generation panel 1 constructed with the plurality of power generation module 4, the deflection and the like of the power generation panel 1 are detected, and the sun tracking control can be performed in the desired state such that the sunlight is efficiently received.

Figure 18:
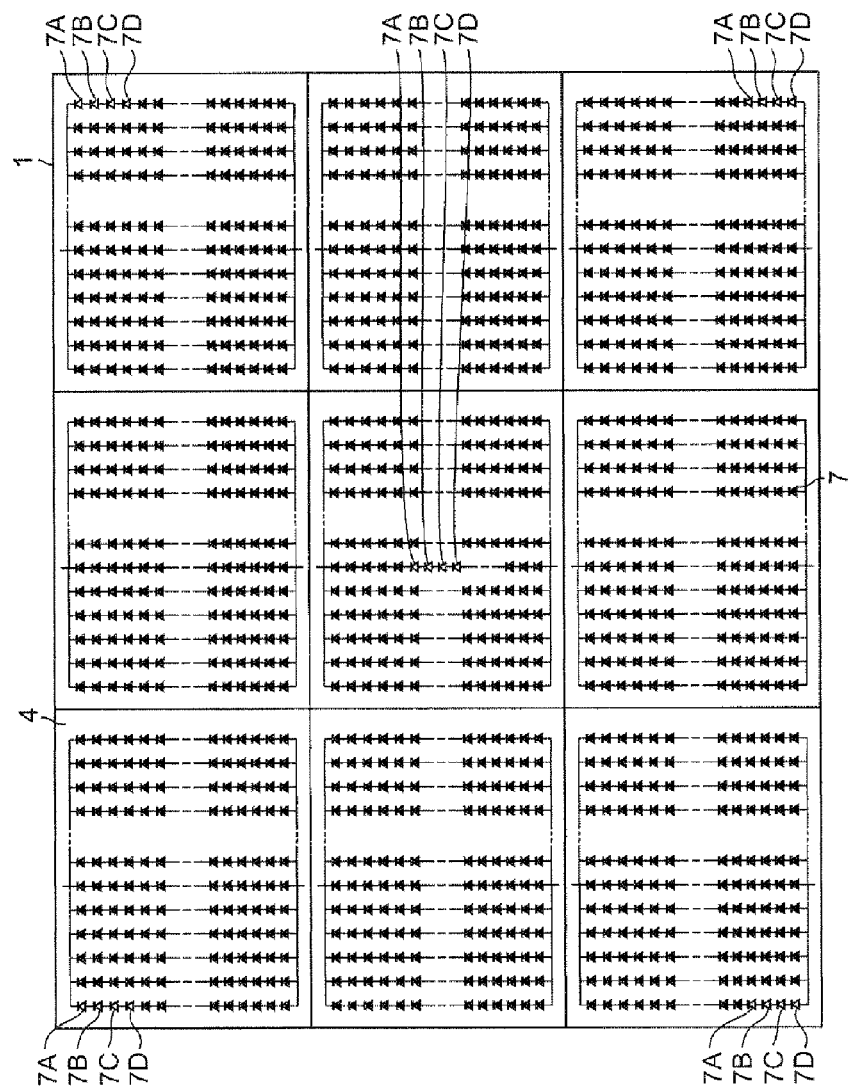
FIG. 18 is a view illustrating an example in which the position shift detection elements are provided in four corners of the power generation panel and a central portion in the concentrating photoelectric conversion device of the first embodiment.

FIG. 18 is a view illustrating an example in which position shift detection element groups 7S are provided in the four corners and the central portion of power generation panel 1 including the substantially quadrangular light receiving surface. Similarly to the case of above power generation module 4, one set of position shift detection element group 7S is provided in one series circuit of the power generation circuit in power generation panel 1. In the case where position shift detection element group 7S located in the central portion of power generation panel 1 is provided on the support member in support 2 of the sun tracking mechanism, for example, at the position corresponding to a gravity center position of the power generation panel, the warp and deflection caused by gravity, wind, and the like are decreased in the central position, and the central position can be used as a reference of the light receiving surface in power generation panel 1.

In FIG. 18, by way of example, position shift detection element groups 7S are provided in the five power generation modules 4 in power generation panel 1. Alternatively, position shift detection element groups 7S may be disposed in at least three power generation modules 4 in power generation panel 1 of the concentrating photoelectric conversion device. By providing position shift detection element groups 7S in three places of power generation panel 1, the position shift of the principal surface of power generation module 1 can be detected while at least the position of the principal surface of power generation panel 1 is defined.

In the case where three sets of position shift detection element groups 7S are provided in power generation panel 1, for example, the three sets of position shift detection element groups 7S is concentrically provided about the support member of sun tracking mechanism 2a of support 2 that supports the central portion of the back of power generation panel 1, for example, the support shaft (rotating shaft extending in the vertical direction), and disposed at equal intervals. Therefore, each position shift detection element group 7S is located at the same distance from the support shaft, and disposed at the position where each position shift detection element group 7S is similarly affected in power generation panel 1. As a result, the detection voltages of the three sets of position shift detection element group 7S can easily be compared to one another to accurately detect the deflection and the like. As used herein, the terms "concentrically" and "equal interval" do not mean "completely concentrically" or "completely equal distance", but includes a range where the substantially similar effect is exerted.

In the disposition positions of position shift detection element groups 7S in power generation panel 1, the position shift detection accuracy can further be enhanced by performing weighted calculation processing of the detection value in consideration of the configuration of the power generation panel.

[Method for Detecting Position Shift and Correcting Angle of Plurality of Position Shift Detection Element]

Figure 19:
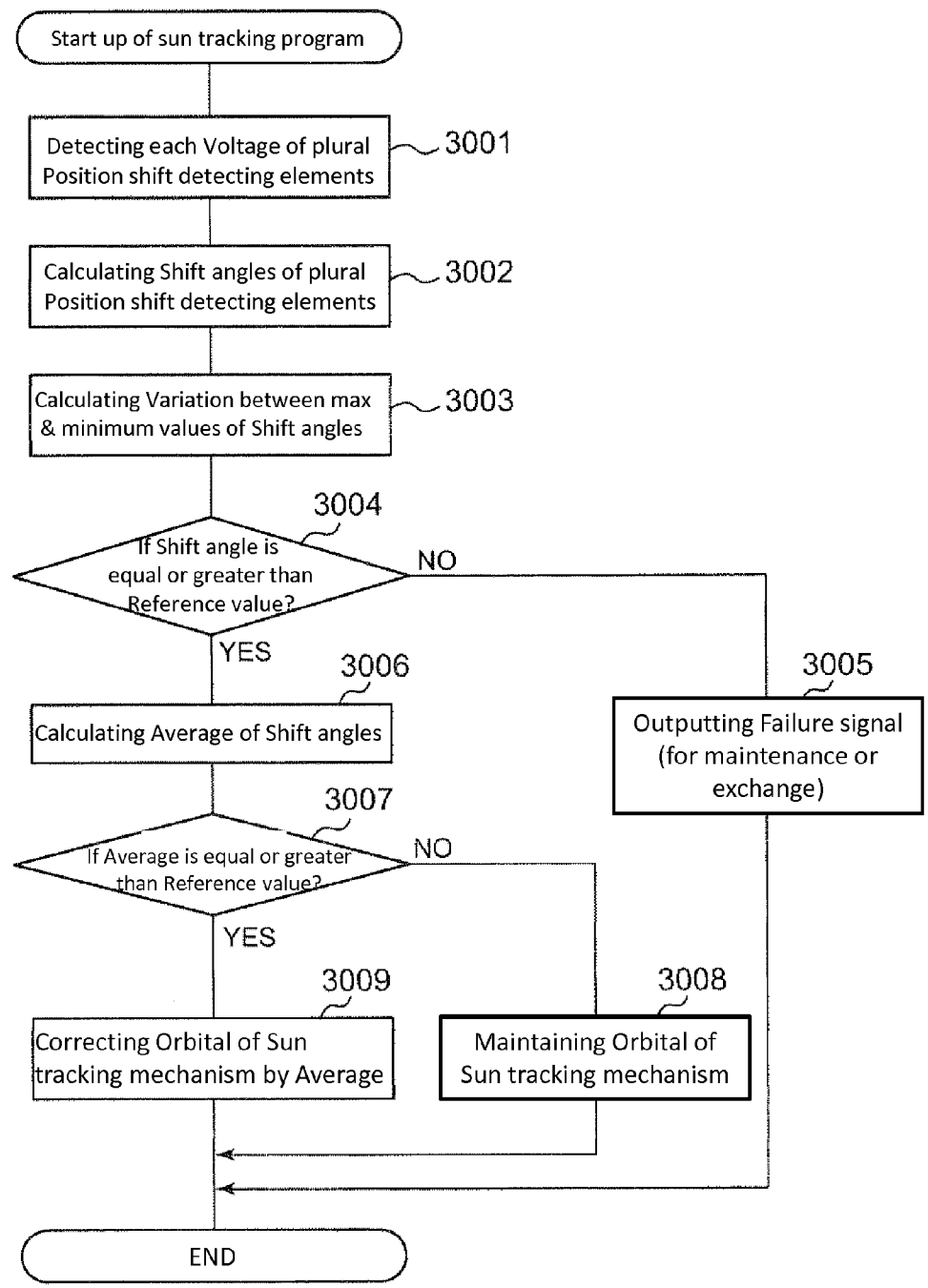
FIG. 19 is a flowchart of a sun tracking program illustrating position shift detection and angle correction methods in the concentrating photoelectric conversion device of the first embodiment when the plurality of position shift detection element groups are installed at predetermined positions of the power generation panel.

FIG. 19 is a flowchart of a sun tracking program illustrating position shift detection and angle correction methods in the case where the plurality of position shift detection element groups 7S are installed at predetermined positions of power generation panel 1. In the sun tracking program of FIG. 19, the controller provided in the concentrating photoelectric conversion device performs the drive control of sun tracking mechanism 2a including the two (X-axis and Y-axis) rotating axes based on the information on the detection voltage of each position shift detection element 7s and the information on the detection voltage of normal power generation element 7n.

In Step 3001 the controller detects the voltage at each of the plurality of position shift detection elements 7s. Voltage difference $\Delta V$ between position shift detection elements 7s is detected in each of the vertical direction (X-axis) and horizontal direction (Y-axis) based on the detected voltage, and the shift angle of the sun tracking is calculated based on each voltage difference $\Delta V$ (Step 3002).

The controller calculates a variation that is of a difference between a maximum value and a minimum value of the shift angles calculated in Step 3002 (Step 3003).

In Step 3004, the controller determines whether each calculated variation is less than or equal to a reference value. When the variation is less than or equal to the reference value, the warp, deflection, and strain of power generation panel 1 are small. On the other hand, when the variation is greater than the reference value, the warp, deflection, and strain are extremely large, and power generation element 7 in which focused spot 300 strays from light receiving region 100 even if the shift angle is corrected is generated in power generation panel 1. For example, for parameters used in the calculation of the numerical value in TABLE 2, when a difference in shift angle between a maximum value and a minimum value has a variation greater than about 0.8° in one of the X-axis and the Y-axis (for example, in the case where focused spot 300 strays from light receiving region 100 with the shift angle of 0.4° or more, the shift angle in the X-axis direction becomes the minimum value of −0.3° and the maximum value of 0.5°), the concentrating photoelectric conversion device including power generation panel 1 is configured to output a failure signal to the outside (Step 3005). In this case, maintenance is performed to readjust power generation panel 1, for example, adjustment work to provide a spacer between power generation module 4 and frame 8 of power generation panel 1 is performed.

The difference in shift angle of the sun tracking between the maximum value and the minimum value is less than or equal to the reference value (for example, 0.8°), and power generation element 7 in which focused spot 300 strays from light receiving region 100 does not exist by properly correcting the angle of the sun tracking even if a certain amount of warp, deflection, or strain is generated in power generation panel 1. In such cases, an average value of the shift angles detected by position shift detection elements 7s is calculated (Step 3006). The average value of the shift angles of the sun tracking in the plurality of places can substantially be considered to be the shift angle of the sun tracking of the whole power generation panel. Accordingly, processing of correcting the sun tracking angle is performed based on the average value.

When the average value of the shift angles is greater than or equal to the reference value in Step 3007, the angle of the sun tracking is corrected by the average value in Step 3009. On the other hand, when the average value of the shift angles is less than the reference value in Step 3007, the orbital position of the sun tracking mechanism is maintained in Step 3008.

Figure 20:
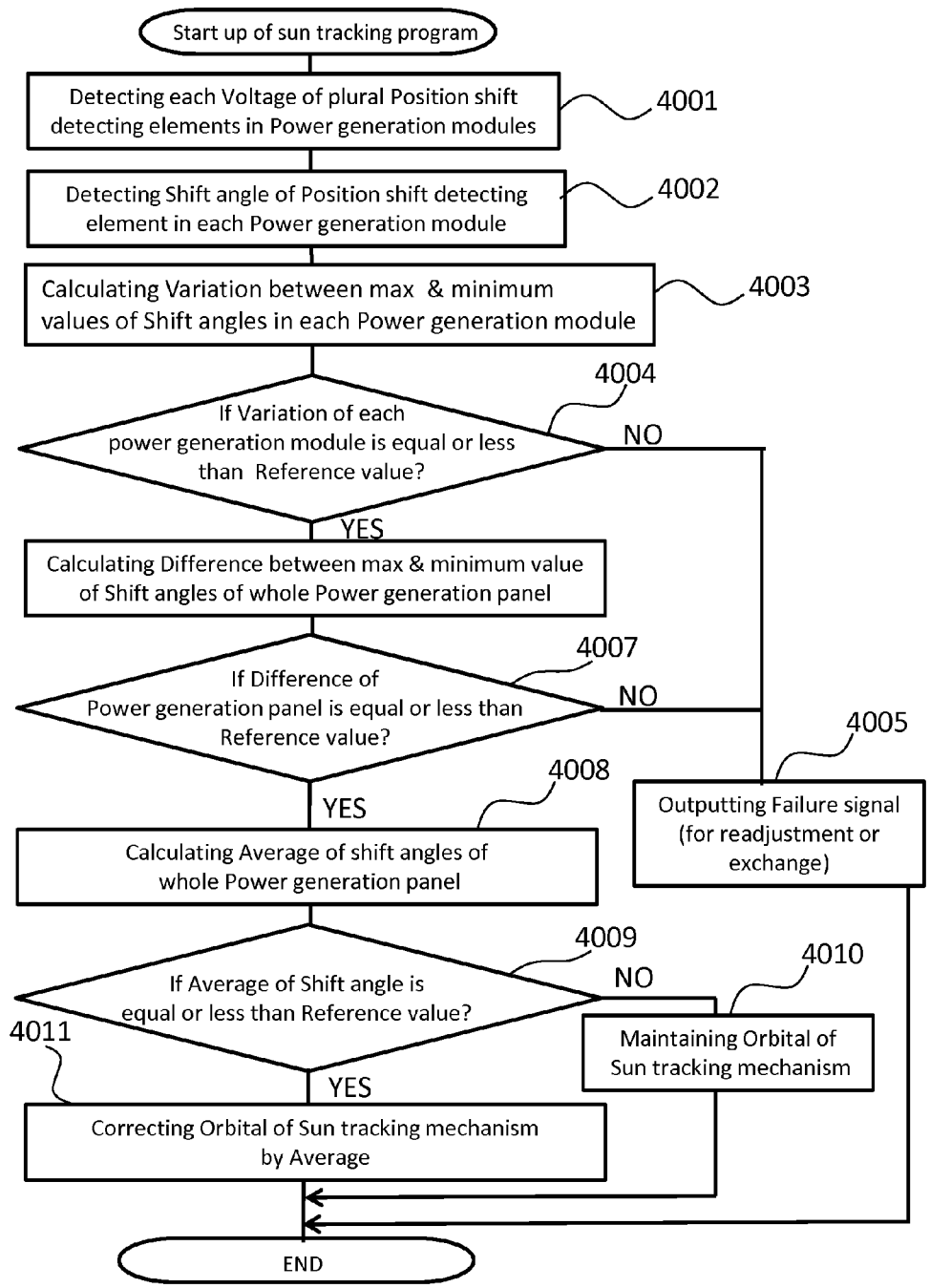
FIG. 20 is a flowchart of the sun tracking program illustrating the position shift detection and angle correction methods in the concentrating photoelectric conversion device of the first embodiment when the plurality of position shift detection elements are installed at predetermined positions of the power generation module.

FIG. 20 is a flowchart of the sun tracking program illustrating the position shift detection and angle correction methods in the case where the plurality of position shift detection elements 7s are installed at predetermined positions of power generation module 4. In the sun tracking program of FIG. 20, the controller provided in the concentrating photoelectric conversion device performs the drive control of sun tracking mechanism 2a including the two (X-axis and Y-axis) rotating axes based on the information on the detection voltage of each position shift detection element 7s and the information on the detection voltage of normal power generation element 7n.

In Step 4001, the controller detects the voltage at each of the plurality of position shift detection elements 7s in all the power generation modules incorporated in power generation panel 1. Voltage differences ΔV in the vertical direction (X-axis) and horizontal direction (Y-axis) are detected based on the detected voltage, and the controller calculates the shift angle of the sun tracking based on each voltage difference ΔV (Step 4002).

The controller calculates the variation that is of the difference between the maximum value and the minimum value of the shift angles calculated for power generation modules 4 in Step 4002 (Step 4003).

In Step 4004, the controller determines whether each calculated variation of power generation module 4 is less than or equal to a reference value. When the variation is less than or equal to the reference value, the warp, deflection, and strain of the power generation module are small. On the other hand, when the variation is greater than the reference value, the warp, deflection, and strain are extremely large, and power generation element 7 in which focused spot 300 strays from light receiving region 100 even if the shift angle is corrected is generated in power generation module 4. In such situations, for example, for parameters used in the calculation of TABLE 2, when a difference in shift angle between a maximum value and a minimum value has a variation greater than about 0.8° in one of the X-axis and the Y-axis (for example, in the case where focused spot 300 strays from light receiving region 100 with the shift angle of 0.4° or more, the shift angle in the X-axis direction becomes the minimum value of −0.3° and the maximum value of 0.5°, power generation module 4 is configured to output to the outside the failure signal indicating that power generation module 4 breaks down (Step 4005). In such situations, the maintenance is performed to readjust or exchange broken-down power generation module 4.

When the variation of each power generation module 4 is less than or equal to reference value in Step 4004, the controller calculates the difference between the maximum value and the minimum value of the shift angle of the sun tracking in the whole power generation panel 1 constructed with the plurality of power generation modules 4 in S4006. Similarly to Step 4004, for example, for the parameters used in the calculation of TABLE 2, when the difference in shift angle between the maximum value and the minimum value has the variation greater than about 0.8° in one of the X-axis and the Y-axis in Step 4007, the failure signal indicating that power generation panel 1 breaks down is output (Step 4005). In this case, the maintenance is performed to readjust power generation panel 1, for example, adjustment work to provide the spacer between power generation module 4 and frame 8 of power generation panel 1 is performed.

In whole power generation panel 1, the difference in shift angle of the sun tracking between the maximum value and the minimum value is less than or equal to a constant value (for example, 0.8°), and power generation element 7 in which focused spot 300 strays from light receiving region 100 does not exist by properly correcting the angle of the sun tracking even if a certain amount of warp, deflection, or strain is generated in power generation panel 1. In such cases, the average value of the shift angles of the sun tracking is calculated (Step 4008). The calculated average value is compared to a reference value (Step 4009), and an operation to correct the angle of the sun tracking is performed when the average value is greater than or equal to the reference value (Step 4011). On the other hand, when the average value is greater than the reference value, the orbital position of the sun tracking mechanism is maintained (Step 4010).

As described above in the sun tracking program in FIG. 13, the sun tracking program in FIGS. 19 and 20 may be activated every about one minute.

In the configuration of the concentrating photoelectric conversion device of the first embodiment, the ever-changing solar position is correctly tracked, and the maximum power generation amount is generated at that time to enhance the power generation efficiency in consideration of the deflection, strain, and warp. Additionally, the failure signal is output to the outside to perform the proper handling when the power generation module and/or the power generation panel is not suitable to the high-efficiency power generation.

In the concentrating photoelectric conversion device of the first embodiment, the mechanism that detects the position shift of the sun tracking is formed using the power generation elements that are of some photoelectric conversion elements in the power generation circuit, which does not lead to weight increase and const increase, so that the weight reduction and the cost reduction can be achieved.

As described above, in the concentrating photoelectric conversion device of the first embodiment, the weight reduction and the cost reduction are achieved using the simple tracking mechanism, and the large-scale panel is disposed at the optimum position corresponding to the solar position at that time to obtain the maximum power generation amount even if the deflection or strain is generated in the large-scale panel.

Second Embodiment

A concentrating photoelectric conversion device according to a second embodiment will be described below with reference to the accompanying drawings. In the concentrating photoelectric conversion device of the second embodiment, the component having the same function and configuration as the first embodiment is designated by the same reference mark, and the description is not given.

In the concentrating photoelectric conversion device of the second embodiment, the power generation circuit including the position shift detection series circuit has the following circuit configuration in order to constrain the decrease in power generation amount during the generation of the position shift. Position shift detection series circuit 80 in the second embodiment is constructed with the series circuit of position shift detection element 7s (7A, 7B, 7C, and 7D) and the plurality of normal power generation elements 7n of the first embodiment.

When all the power generation elements constituting the power generation circuit are used to detect the position shift, the power generation amount decreases largely during the generation of the position shift. Therefore, the concentrating photoelectric conversion devices of the first and second embodiments have the following configuration in order to avoid the decrease in power generation amount during the detection of the position shift.

In the concentrating photoelectric conversion device of the second embodiment, similarly to the concentrating photoelectric conversion device of the first embodiment, both power generation element (normal power generation element) 7n in which the center of light receiving region 100 is set to the center position of focused spot 300 while the position shift is not generated and power generation element (position shift detection element) 7s that is also used to detect the position shift while the center position of focused spot 300 is disposed at the position shifted from the center position of light receiving region 100 perform the power generation.

In the concentrating photoelectric conversion device of the second embodiment, the power generation circuit is constructed with the plurality of normal power generation element series circuits 70 each of which is formed by connecting only normal power generation elements 7n in series and the plurality of position shift detection series circuits 80 in which four position shift detection elements 7s (7A, 7B, 7C, and 7D) shifted in the upward, downward, leftward, and rightward directions from the center position of the focused spot are connected in series to the normal power generation elements 7n. As described above, the plurality of normal power generation elements 7n are connected in series to position shift detection series circuit 80 such that a shared voltage at each of position shift detection elements 7A, 7B, 7C, and ID is decreased in shift detection series circuit 80.

Particularly, in the concentrating photoelectric conversion device of the second embodiment, an element having a characteristic of a short-circuit current larger than a minimum short-circuit current of an element in normal power generation elements 7n provided in position shift detection series circuit 80 is used as position shift detection element 7s (7A, 7B, 7C, and 7D) provided in position shift detection series circuit 80. That is, in the power generation state in absence of the position shift, each power generation element 7 in position shift detection series circuit 80 is previously selected such that the voltage at position shift detection series circuit 80 is larger than the voltage at normal power generation element series circuit 70.

As described above, the concentrating photoelectric conversion device of the second embodiment specifies the specification of position shift detection element 7s (7A, 7B, 7C, and ID) constituting position shift detection series circuit 80, and the basic configuration of the concentrating photoelectric conversion device of the second embodiment is identical to that of the concentrating photoelectric conversion device of the first embodiment. Accordingly, the difference between the concentrating photoelectric conversion devices of the first and second embodiments will be described below using the power generation circuit of power generation module 4 in FIG. 17A.

In the power generation circuits in FIGS. 17A to 17D, the parallel circuit is constructed with many normal power generation element series circuits 70 and the plurality of position shift detection series circuits 80 provided at the predetermined positions. Many normal power generation elements 7 are provided in each position shift detection series circuit 80 while many normal power generation element series circuits 70 are provided, whereby a ratio of the decrease in current amount of the power generation circuit can be reduced while a ratio of the decrease in voltage of the whole power generation circuit when the generation of the position shift is detected.

In the concentrating photoelectric conversion device of the second embodiment, an element having the maximized short-circuit current is used as position shift detection element 7s. That is, the power generation element having the short-circuit current larger than that of normal power generation element 7 used in position shift detection series circuit 80 is used as position shift detection element 7s. Thus, in the case where the current value of position shift detection element 7s decreases due to the generation of the position shift, the element having the larger short-circuit current is used as position shift detection element 7s to be able to decrease the influence on the power generation efficiency and the power generation amount.

In the concentrating photoelectric conversion device of the second embodiment, the power generation element having the characteristic of the high output voltage is previously selected in consideration of the variation in characteristic of power generation element 7, and the power generation element having the characteristic of the higher output voltage is used in position shift detection series circuit 80 such that the voltage at whole position shift detection series circuit 80 is higher than the voltage at whole normal power generation element series circuit 70. Therefore, the influence on the power generation circuit of the whole concentrating photoelectric conversion device can be decreased even if the voltage value of position shift detection element 7s decreases during the detection of the position shift.

As described above, the concentrating photoelectric conversion device of the second embodiment can exert the same action and effect as the first embodiment, and further constrain the decrease in power generation amount during the detection of the position shift to obtain the high power generation efficiency.

Third Embodiment

A concentrating photoelectric conversion device according to a third embodiment will be described below with reference to the accompanying drawings. In the concentrating photoelectric conversion device of the third embodiment, the component having the same function and configuration as the first and second embodiments is designated by the same reference mark, and the description is not given.

The concentrating photoelectric conversion device of the third embodiment has a configuration for enhancing the detection accuracy of position shift detection element 7s in addition to the technical features of the concentrating photoelectric conversion devices of the first and second embodiments.

In the concentrating photoelectric conversion device, at the time of measuring the voltages at position shift detection elements 7s located in the plurality of places, desirably the voltages are measured with the same current value. Although each position shift detection series circuit 80 is formed using the component having the same specification so as to obtain the same current value, the current values do not always coincide with each other.

Therefore, the concentrating photoelectric conversion device of the third embodiment is configured to further enhance the detection accuracy of position shift detection element 7s.

Figure 21:
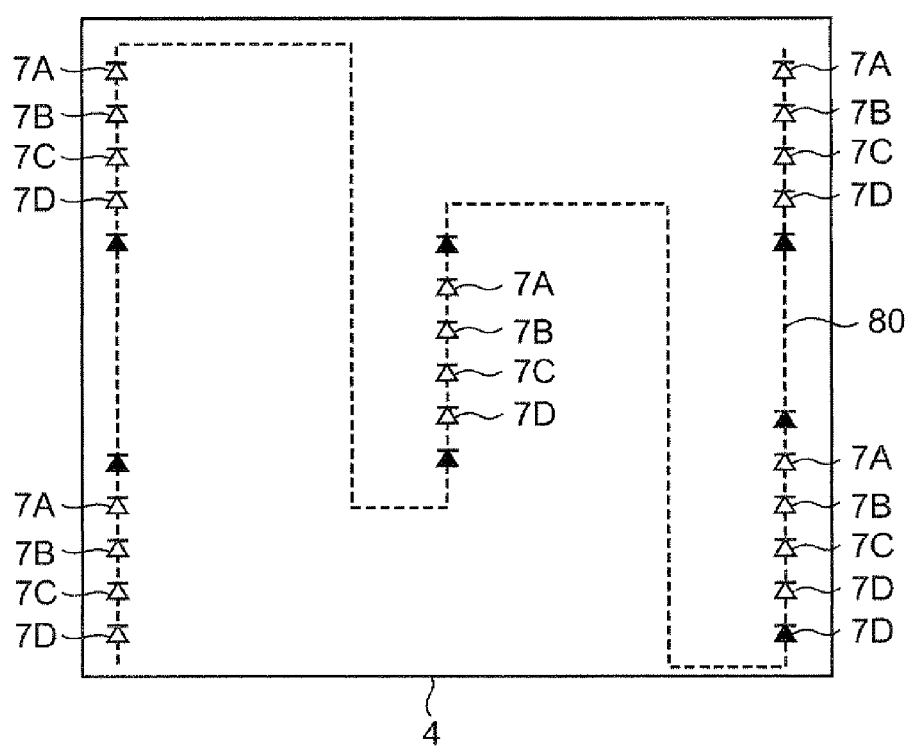
FIG. 21 is a view illustrating a circuit configuration of the position shift detection series circuit of the power generation module in the concentrating photoelectric conversion device of the third embodiment.

FIG. 21 is a view illustrating a circuit configuration of position shift detection series circuit 80 of power generation module 4 in the concentrating photoelectric conversion device of the third embodiment. As illustrated in FIG. 21, the five sets of position shift detection element groups 7S (7A, 7B, 7C, and 7D) are provided in the four corners and central portion of power generation module 4, and connected in series. Accordingly, the current having the same value is passed through the power generation element of each of the five sets of position shift detection element groups 7S such that each voltage difference can accurately be detected. In the circuit configuration of FIG. 21, an element having an open voltage higher than that of another normal power generation element 7n is used as position shift detection element 7s used in position shift detection series circuit 80 such that the voltage does not largely decrease in position shift detection series circuit 80 when the position shift is detected. Thus, when the specification of position shift detection element 7s in position shift detection series circuit 80 is previously selected, the voltage can be constrained from being decreased lower than that of normal power generation element series circuit 70 during the detection of the position shift, and the decrease in power generation amount can be constrained.

Figure 22:
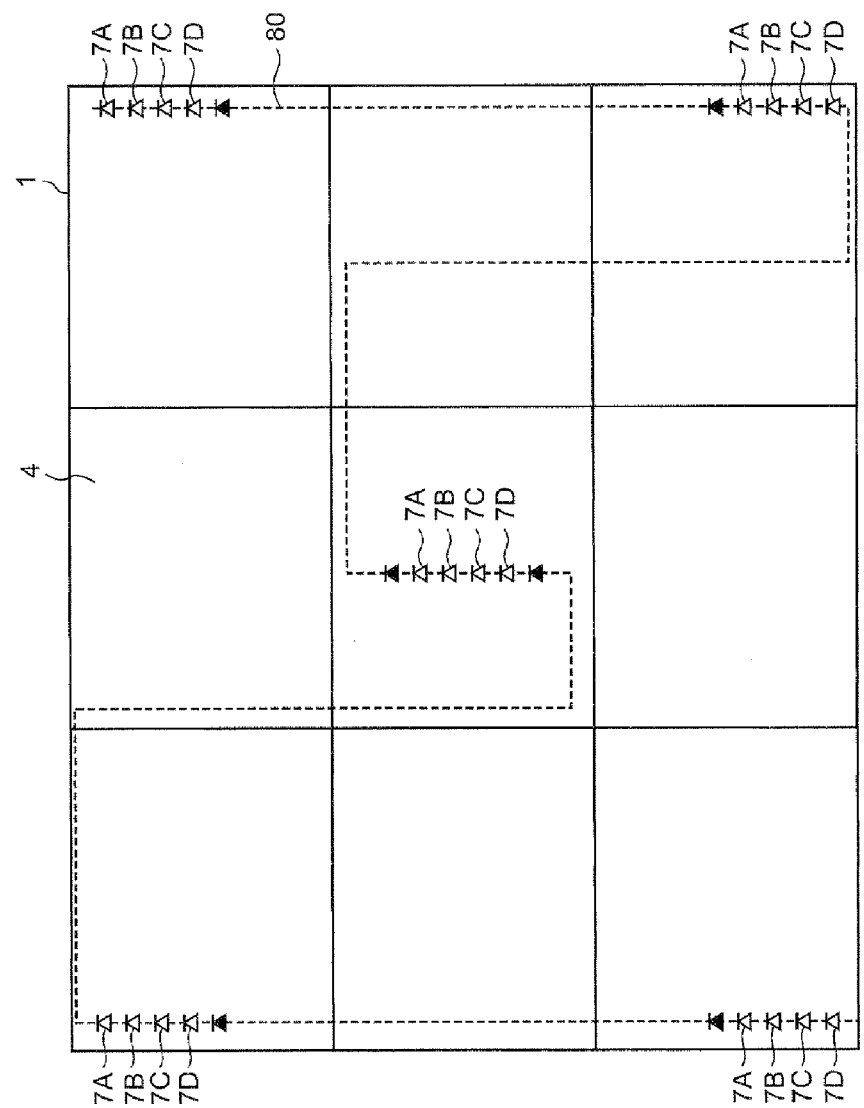
FIG. 22 is a view illustrating a modification in concentrating photoelectric conversion device according to a third embodiment.

FIG. 22 is a view illustrating an another configuration example (modification) in the concentrating photoelectric conversion device of the third embodiment. In the concentrating photoelectric conversion device of FIG. 22, the five sets of position shift detection element groups 7S (7A, 7B, 7C, and 7D) are provided in the four corners and central portion of power generation panel 1, and connected in series. Accordingly, in order to perform the drive control of the X-axis and Y-axis of power generation panel 1, the current having the same value is passed through the power generation element of each of the five sets of position shift detection element groups 7S such that each voltage difference can accurately be detected. In power generation panel 1 having the above configuration, an element having the open voltage higher than that of another normal power generation element 7n is used as position shift detection element 7s used in position shift detection series circuit 80 such that the voltage does not largely decrease in position shift detection series circuit 80 when the position shift is detected. Thus, when the specification of position shift detection element 7s in position shift detection series circuit 80 is previously selected, the voltage can be constrained from being decreased lower than that of normal power generation element series circuit 70 during the detection of the position shift, and the decrease in power generation amount can be constrained.

In the concentrating photoelectric conversion device of the third embodiment, by way of example, the five sets of position shift detection element groups 7S (7A, 7B, 7C, and 7D) are provided in the four corners and central portion of power generation module 4 (FIG. 21) or power generation panel 1 (FIG. 22). Alternatively, position shift detection element groups 7S (7A, 7B, 7C, and 7D) may be provided in three positions or four corners that can define the main plane (principal surface). When position shift detection element groups 7S (7A, 7B, 7C, and 7D) are provided in at least three positions and connected in series, the voltage difference can accurately be measured.

As described above, in the concentrating photoelectric conversion device of the third embodiment, because the voltage difference can be detected at the same current value in any one of position shift detection elements 7s located at the plurality of places, the voltage difference can accurately be measured, and the detection of the shift angle and the sun tracking operation can accurately be performed.

In the concentrating photoelectric conversion device of the third embodiment, the method (the first detection method or the second detection method) described in the first embodiment is adopted as the method for correcting the angle of the sun tracking based on the voltage difference.

The sun tracking program used in each embodiment may be downloaded from a server and executed by the controller of the concentrating photoelectric conversion device. Alternatively, the sun tracking program may be executed by reading the program recorded in a predetermined recording medium (for example, optical disks such as CD-ROM, a magnetic disk, and a semiconductor memory). A single or plurality of computers may execute the sun tracking program. That is, either integrated processing or distributed processing may be performed.

The effects of the embodiments or modifications can be exerted by properly combining the embodiments or modifications.

In the present disclosure, a power generation panel includes a light receiving surface including a normal photoelectric conversion element and a position shift detection demerit group including a first position shift detection element, a second position shift detection element, a third position shift detection element, and a fourth position shift detection element. At this point, the normal photoelectric conversion element includes a normal light collecting lens that collects incident light and a normal light receiving region that has a center position coinciding with a center of a light collecting region through which the collected light passes, the normal photoelectric conversion element converts the light received in the normal light receiving region into electricity, the first photoelectric conversion element includes a first light collecting lens that collects the incident light and a first light receiving region that has a center position shifted in an upward direction from the center of the light collecting region thorough which the collected light passes, the first photoelectric conversion element converts the light received in the first light receiving region into electricity, the second photoelectric conversion element includes a second light collecting lens that collects the incident light and a second light receiving region that has a center position shifted in a downward direction from the center of the light collecting region thorough which the collected light passes, the second photoelectric conversion element converts the light received in the second light receiving region into electricity, the third photoelectric conversion element includes a third light collecting lens that collects the incident light and a third light receiving region that has a center position shifted in a rightward direction from the center of the light collecting region thorough which the collected light passes, the third photoelectric conversion element converts the light received in the third light receiving region into electricity, the fourth photoelectric conversion element includes a fourth light collecting lens that collects the incident light and a fourth light receiving region that has a center position shifted in a leftward direction from the center of the light collecting region thorough which the collected light passes, the fourth photoelectric conversion element converts the light received in the fourth light receiving region into electricity, and the position shift detection element groups are disposed in at least three places of the light receiving surface.

In the present disclosure, a concentrating photoelectric conversion device includes a light tracking mechanism that supports the power generation panel to oppose the light receiving surface of the power generation panel to the light. At this point, the light tracking mechanism changes the light receiving surface into a direction opposed to the light using the electricity converted by each of the first position shift detection element, the second position shift detection element, the third position shift detection element, and the fourth position shift detection element in the position shift detection element group.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

INDUSTRIAL APPLICABILITY

For example, the concentrating photoelectric conversion device of the present disclosure can be used in the solar cell in which the sunlight is used as the safety, environmentally-friendly energy source.

REFERENCE SIGNS LIST

1 power generation panel
2 support
2a sun tracking mechanism
2b base
4 power generation module
5 lens array
6 wiring board
7 power generation element
7n normal power generation element (normal photoelectric conversion element)
7s position shift detection element
7S position shift detection element group
70 normal power generation element series circuit
80 position shift detection series circuit
100 light receiving region
300 focused spot

The invention claimed is:

1. A concentrating photoelectric conversion device comprising:
a power generation panel including a light receiving surface and power generation modules; and
a support that supports the power generation panel and includes a light tracking mechanism, wherein:
the power generation modules are arrayed in a planar manner,
each of the power generation modules includes a lens array having light collecting lenses, a wiring board, photoelectric convertors connected in series and position shift detectors,
each of the photoelectric convertors has a first light receiving region, collects light incident onto the first light receiving region and generates first electric power with the collected light incident thereon,
each of the position shift detectors has a second light receiving region, collects light incident onto the second light receiving region and generates second electric power with the collected light incident thereon, respectively,
the light collecting lenses of the lens array have focus spots on the wiring board, respectively, onto which the light is collected by the light collecting lenses,
a center of each of the first light receiving regions of the photoelectric convertors is disposed on a center of corresponding one of the focus spots,
the position shift detectors include a first position shift detector, a second position shift detector, a third position shift detector, and a fourth position shift detector, the first to fourth position shift detectors being connected in series,
a center of the second light receiving region of the first position shift detector is disposed on a position shifted from a center of corresponding one of the focus spots in upward direction by a predetermined distance, a center of the second light receiving region of the second position shift detector is disposed on a position shifted from a center of corresponding one of the focus spots in downward direction by the predetermined distance, a center of the second light receiving region of the third position shift detector is disposed on a position shifted from a center of corresponding one of the focus spots in rightward direction by the predetermined distance, and a center of the second light receiving region of the fourth position shift detector is disposed on a position shifted from a center of corresponding one of the focus spots in leftward direction by the predetermined distance,
a group of the first to fourth position shift detectors detects a position shift by comparing the second electric power generated within the group with the first electric power generated by the photoelectric convertors connected in parallel with the group of the first to fourth position shift detectors,
at least three groups of the first to fourth position shift detectors are disposed in the light receiving surface, and
the light tracking mechanism corrects a position of the light receiving surface based on detected position shifts of the at least three groups.

2. The concentrating photoelectric conversion device according to claim 1, wherein the at least three groups of the first to fourth position shift detectors are connected in series.

3. The concentrating photoelectric conversion device according to claim 1, wherein:
the support further comprises a support member,
the support member supports in a central portion of a back of the power generation panel,
the support is turned in two axial directions by the light tracking mechanism, and
the at least three groups of the first to fourth position shift detectors are provided in a concentric manner about the central portion of the power generation panel, and provided at equal intervals.

4. The concentrating photoelectric conversion device according to claim 1, wherein:
the light receiving surface of the power generation panel has a substantially quadrangular shape,
four groups of the first to fourth position shift detectors are disposed in the light receiving surface, and
the four groups of the first to fourth position shift detectors are provided in four corners of the light receiving surface of the power generation panel.

5. The concentrating photoelectric conversion device according to claim 1, wherein:
the light receiving surface of the power generation panel has a substantially quadrangular shape,
five groups of the first to fourth position shift detectors are disposed in the light receiving surface, and
the five groups of first to fourth position shift detectors are provided in four corners and a central portion of the light receiving surface of the power generation panel.

6. The concentrating photoelectric conversion device according to claim 1, wherein the light tracking mechanism calculates a voltage difference between the first electric power and the second electric power with respect to the at least three groups of the first to fourth position shift detectors, and turns the power generation panel in two axial directions to correct a shift angle based on the voltage difference.

* * * * *